(12) United States Patent
Nomura et al.

(10) Patent No.: US 7,573,538 B2
(45) Date of Patent: *Aug. 11, 2009

(54) LIQUID CRYSTAL DISPLAY DEVICE AND METHOD FOR MANUFACTURING THE SAME

(75) Inventors: Shinichiro Nomura, Tottori (JP); Takayuki Kato, Tottori (JP); Satoshi Morita, Tottori (JP); Hideki Kaneko, Tottori (JP); Masahiro Horiguchi, Tottori (JP)

(73) Assignee: Epson Imaging Devices Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/998,955

(22) Filed: Dec. 3, 2007

(65) Prior Publication Data

US 2008/0129908 A1 Jun. 5, 2008

(30) Foreign Application Priority Data

Dec. 4, 2006 (JP) ............................. 2006-326560

(51) Int. Cl.
G02F 1/1343 (2006.01)
(52) U.S. Cl. .................. 349/39; 438/30; 257/E21.535; 349/42; 349/46; 349/47
(58) Field of Classification Search .................. 349/33, 349/43–44, 36–39, 41–47; 438/30; 257/E21.535
See application file for complete search history.

(56) References Cited

U.S. PATENT DOCUMENTS 5,920,082 A * 7/1999 Kitazawa et al. .............. 257/59
6,356,318 B1 3/2002 Kawahata 2003/0038306 A1* 2/2003 Izumi et al. .................. 257/222
2004/0141100 A1* 7/2004 Tsubata et al. ................. 349/44
2005/0092992 A1* 5/2005 Nagata et al. .................. 257/59
2005/0285987 A1* 12/2005 Azumada et al. .............. 349/43
2006/0009108 A1* 1/2006 Shigeno ........................ 445/24

(Continued)

FOREIGN PATENT DOCUMENTS

JP 2584290 3/1990

(Continued)

*Primary Examiner*—Ellen Kim
(74) *Attorney, Agent, or Firm*—Harness, Dickey & Pierce, P.L.C.

(57) ABSTRACT

A liquid crystal display panel 10A of the invention has gate electrodes G of TFTs, scan lines 16, and auxiliary capacitor electrodes 18a, which are coated with a first insulating film 27 composed of a thick insulating layer 25 and thinned insulating layer 26. A part above the auxiliary capacitor electrodes 18a is coated only with the thinned insulating layer 26, and drain electrodes D are extended on the first insulating film 27, which is not thinned, so as to coat the thinned insulating layer 26. On a second insulating film 28 provided between the pixel electrodes 20 and the drain electrodes D, contact holes 30 are formed at portions above the drain electrodes D on the first insulating film 27, which is not thinned, above the auxiliary capacitor electrodes 18a, and via the contact holes 30, the pixels 20 and the drain electrodes D are electrically coupled to each other. By providing such a constitution, a liquid crystal display device and its manufacturing method can be provided, with only a small number of bright point defects, and with an increased capacitance of the auxiliary capacitor electrodes without a reduction in the aperture ratio of each pixel.

12 Claims, 15 Drawing Sheets

U.S. PATENT DOCUMENTS

| | | | |
|---|---|---|---|
| 2006/0267969 A1* | 11/2006 | Doi et al. | 345/204 |
| 2007/0146566 A1* | 6/2007 | Hosoya | 349/43 |
| 2008/0198108 A1* | 8/2008 | Aoki | 345/87 |
| 2008/0254598 A1* | 10/2008 | Yamazaki et al. | 438/473 |

FOREIGN PATENT DOCUMENTS

| | | |
|---|---|---|
| JP | 04-336530 | 11/1992 |
| JP | 2001-013520 | 1/2001 |
| JP | 2002-236286 | 8/2002 |
| JP | 2006-184115 | 7/2006 |
| JP | 2007-121793 | 5/2007 |
| JP | 2007-148345 | 6/2007 |
| WO | WO 2005-121884 | 12/2005 |

* cited by examiner

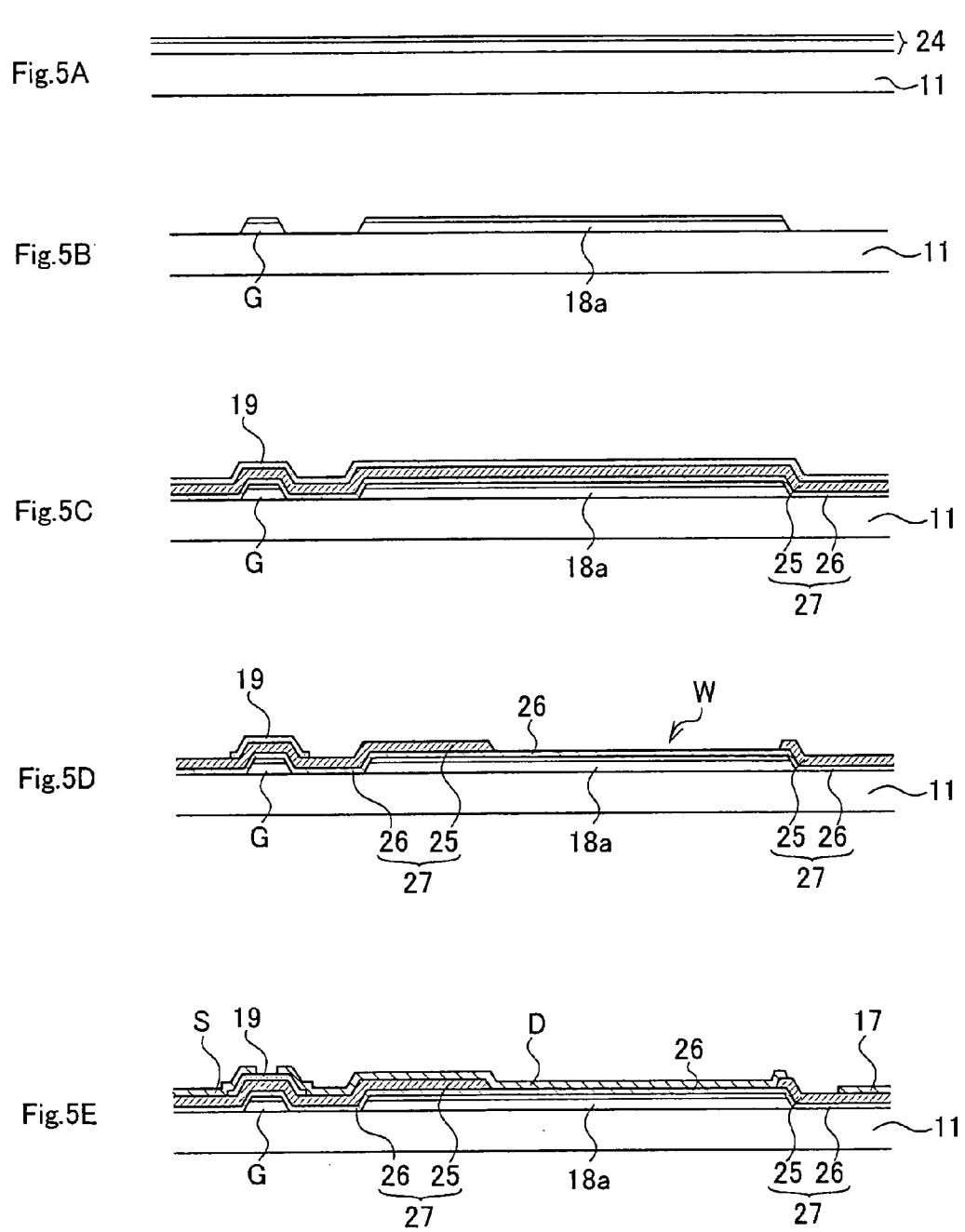

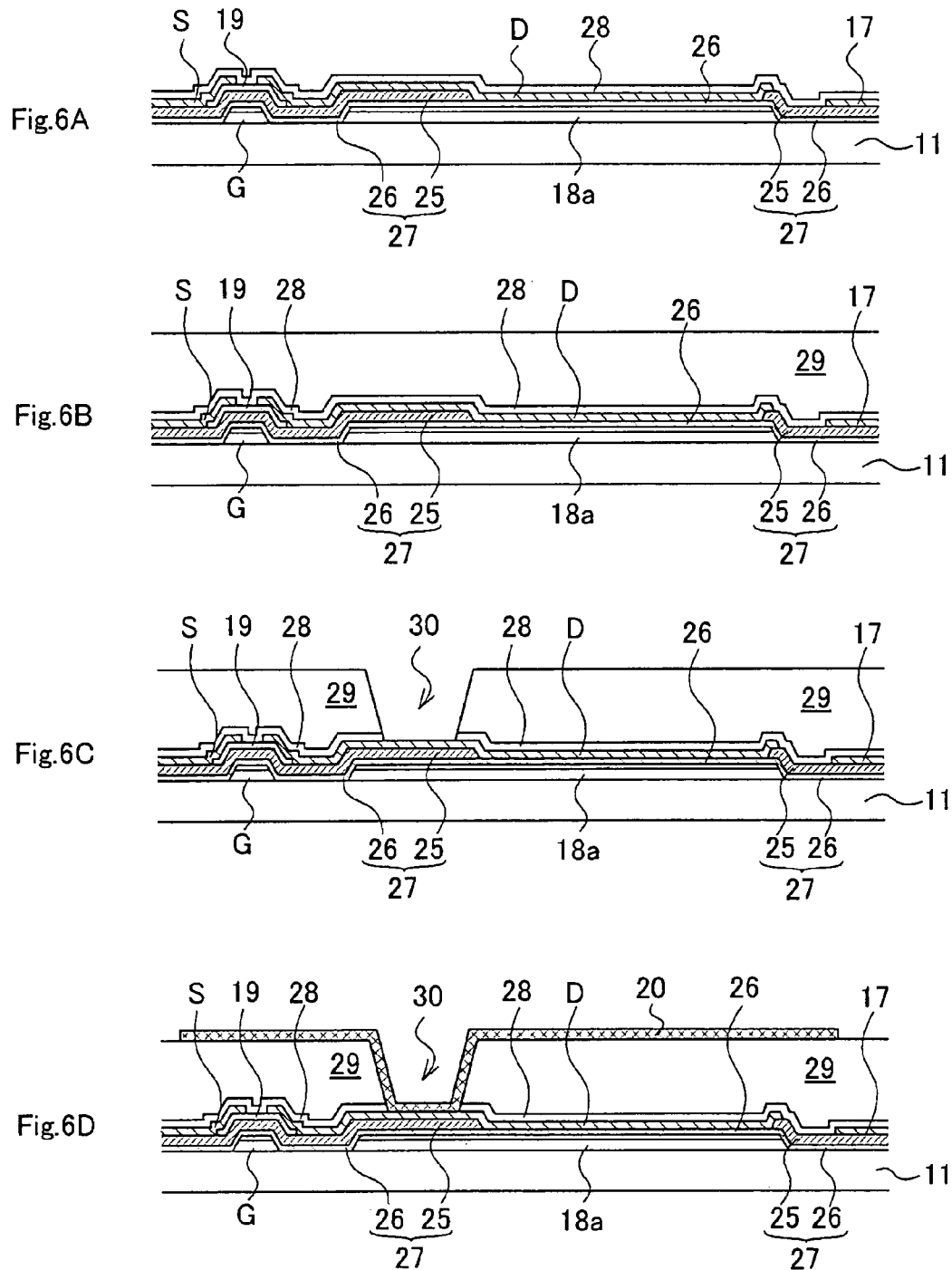

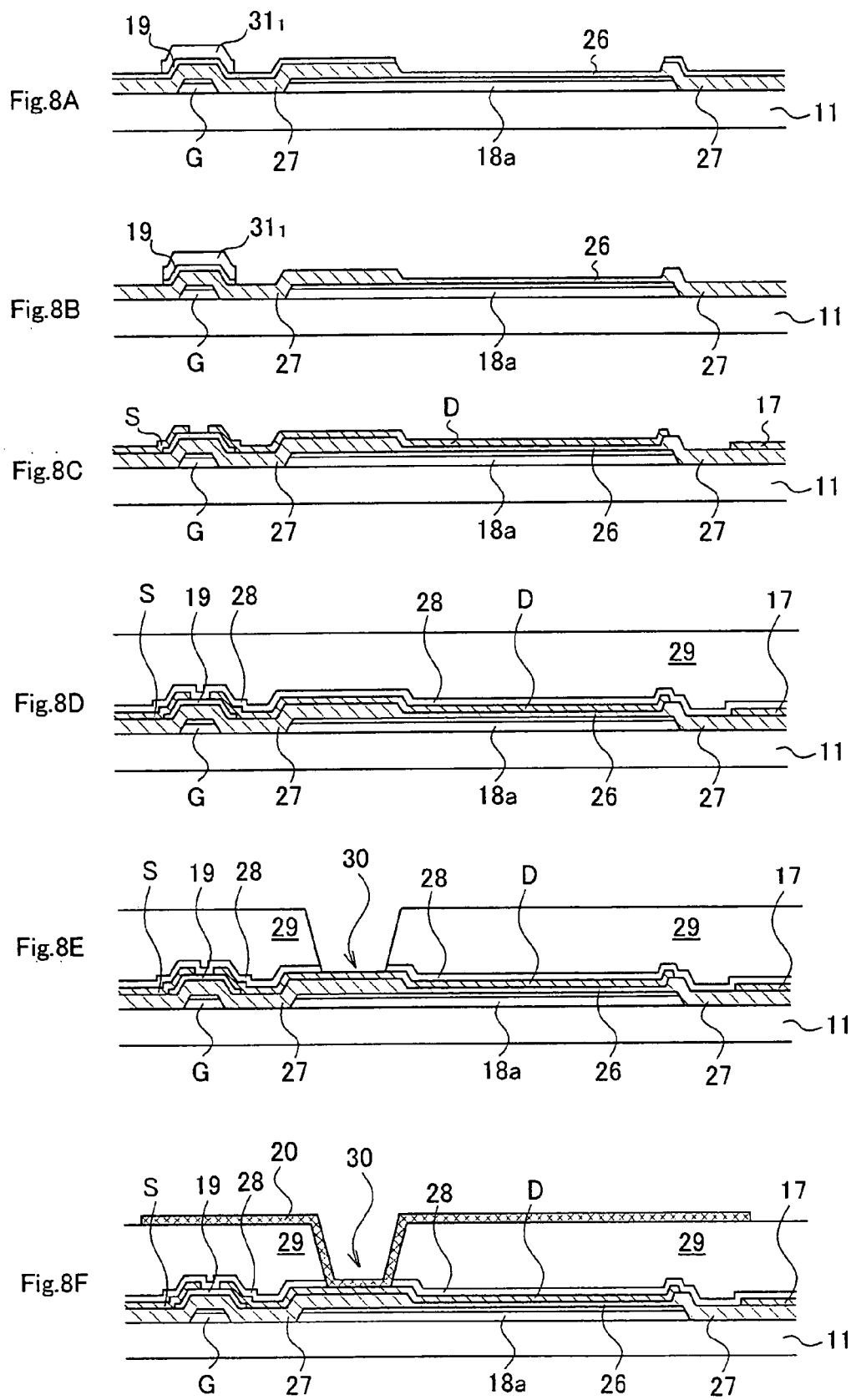

(prior art)

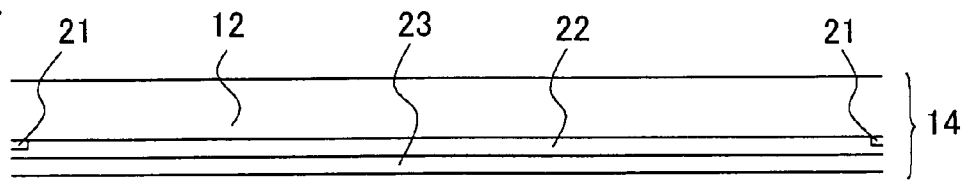
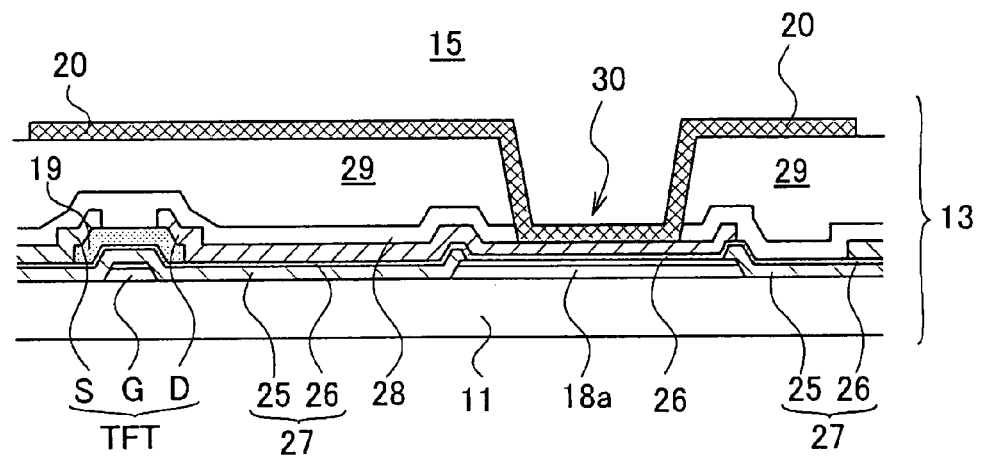
Fig.13(prior art)

(prior art)

LIQUID CRYSTAL DISPLAY DEVICE AND METHOD FOR MANUFACTURING THE SAME

BACKGROUND

1. Technical Field

The present invention relates to a liquid crystal display device. More particularly the invention relates to a liquid crystal display device in which bright point defects scarcely occur during manufacturing, and in addition, an auxiliary capacitance is increased without a reduction in the aperture ratio of each pixel, thereby making it possible to achieve a good display picture quality with little flicker and cross talk even in a liquid crystal display device having pixels that have comparatively small pixel areas or that are made high-definition, and to a method for manufacturing the same.

2. Related Art

In recent years, liquid crystal display devices have been commonly used not only in information communication devices but also in general electrical equipment. Such a liquid crystal display device comprises the following elements: an array substrate, which forms on its surface a matrix of scan lines and signal lines, and in the areas enclosed by these lines, forms thin film transistors (hereinafter called TFTs) acting as the switching elements for driving liquid crystal, pixel electrodes that apply voltage to the liquid crystal, and an auxiliary capacity formed by auxiliary capacitor lines and auxiliary capacitor electrodes to hold signals; an opposed substrate, which forms on its surface the color filter layers of red (R), green (G), and blue (B) as well as a common electrode and so on; and liquid crystal filled between the two substrates.

The auxiliary capacitor electrodes that are formed on the array substrate are provided to form an auxiliary capacity that holds for a certain period of time the electric charge of the signals supplied from the signal lines. The auxiliary capacity is provided by forming an auxiliary capacitor that uses as electrodes the auxiliary capacitor electrodes and part of the TFT's drain electrode or pixel electrode, and as a dielectric body the gate insulating film that covers the TFT's gate electrode. The auxiliary capacitor lines and auxiliary capacitor electrodes are generally formed from a light-blocking conductive material such as aluminum, molybdenum, or chromium. In addition, as shown, for example, in FIG. 9, which is a schematic plan view of a pixel in a liquid crystal display device, it is a common practice that an auxiliary capacitor line 51 and an auxiliary capacitor electrode 52 are provided separated from a TFT 53 and located in the central part of each pixel.

From the viewpoint of preventing flicker and cross talk in the liquid crystal display device, the auxiliary capacity needs to be made large in its capacitance. However, the size of the individual pixels has been reduced as the liquid crystal display device has become smaller and higher-definition with the technological innovations of recent years. Therefore, in a liquid crystal display device 50 in which the auxiliary capacitor line 51 or the auxiliary capacitor electrode 52 is arranged as shown in FIG. 9, it is practically difficult to adopt the idea of thickening the auxiliary capacitor line 51 or the auxiliary capacitor electrode 52 to increase the auxiliary capacitance when considering the aperture ratio of each pixel, because the auxiliary capacitor line 51 and the auxiliary capacitor electrode 52 block light.

As a method to resolve the above problem, there is disclosed an invention of a liquid crystal display device in which an auxiliary capacitance is made larger than that of conventional examples, without changing the size of an auxiliary capacitor electrode. The array substrate in a liquid crystal display device 90 that is disclosed in this invention of Japanese Patent No. 2584290 will be described using FIG. 10 and FIG. 11. FIG. 10 is a plan view of several pixel portions of a array substrate disclosed in Japanese Patent No. 2584290, and FIG. 11A to FIG. 11G are partial cross-sectional views showing in sequence the process of manufacturing the array substrate of FIG. 10.

First of all, an auxiliary capacitor line 92 made of indium tin oxide (ITO) or indium zinc oxide (ITO) is pattern-formed over an insulating substrate 91 made of glass plate. Then a gate metal film 93 is formed and patterned (FIG. 11A). Furthermore, by means of plasma CVD or other, an insulating film 94 made of $SiN_x$ or $SiO_x$, an amorphous semiconductor film 95 made of for example a-Si as an active layer, and a semiconductor film 96 for ohmic contact made of for example $n^+$a-Si film doped with impurities, are formed one after another (FIG. 11B). At this point, the thickness X of the insulating film is made sufficiently thick, for example as X=4000 Å, to ensure that no short circuit will occur between the drain and gate or between the source and gate.

Next, the semiconductor film 96 for ohmic contact and the amorphous semiconductor film 95 are etched into patterns with the same resist (FIG. 11C). Then, the resist (not shown in FIG. 11), which remains as aperture patterns (broken-line portions in FIG. 10) at the portions where the auxiliary capacitor line 92 overlaps a pixel electrode 97 to be formed in the subsequent process, is coated, and by means of the etchant for the insulating film 94, such portions are etched to be thinned to the intended thickness Y=2000 Å to serve as the auxiliary capacitor insulating film (FIG. 11D).

Next, the pixel electrode 97 made of ITO is formed and patterned (FIG. 11E). Then a metal film 98 for drain and source is also formed and patterned (FIG. 11F), and the semiconductor film 96 for ohmic contact that is left on a TFT channel portion is etched away, whereupon the array substrate for the liquid crystal display device is completed (FIG. 11G). The liquid crystal display device 90 is then obtained by placing opposite to each other the array substrate structured as above and a common electrode substrate, with liquid crystal substance interposed between them.

In such a related-art technology, the auxiliary capacitor line 92 and pixel electrode 97 are equivalent to the electrodes of a capacitor, and the insulating film 94 located between the auxiliary capacitor line 92 and pixel electrode 97 is equivalent to the dielectric body of a capacitor. Because the thickness X of the insulating film 94 over the gate metal film 93 is 4000 Å, whereas the thickness Y of the insulating film over the auxiliary capacitor line 92 is made to be 2000 Å, this technology has the advantages that short circuits are unlikely to occur between the drain and gate or the source and gate, and moreover that the required auxiliary capacitance can be secured even if the area of the auxiliary capacitor line 92 is not enlarged.

However, in the array substrate of the liquid crystal display device 90 disclosed in Japanese Patent No. 2584290, the surface of the auxiliary capacitor line is partially etched so that the gate insulating film alone is made thin, and thereby the auxiliary capacitance is increased, with electrical insulation being kept unchanged between a gate electrode and scan line covered by the gate insulating film on the one hand, and other members on the other hand. As a result, a larger auxiliary capacitance can be secured compared with the case in which an auxiliary capacitor electrode of conventional examples is used. However, the processing time is increased because the auxiliary capacitor line 92 uses a transparent conductive material such as ITO, which is different from the gate metal film 93. Moreover, there is still a room for improvement in aperture ratio because the area of the auxiliary capacitor line overlapping the pixel electrode is large.

On the other hand, the present inventors found the following method for resolving the problem of the liquid crystal display device 90 disclosed in Japanese Patent No. 2584290, and applied the invention as Japanese Patent Application No. 2006-184115 (hereinafter called "prior application"). A drain electrode of a TFT is extended and used as an electrode pairing with the auxiliary capacitor line, which is an electrode of the capacitor forming an auxiliary capacity, and between the electrode pair is interposed, in place of the gate insulating film, a thinned insulating layer that is made thinner than the gate insulating film. By this method, the capacitance of the auxiliary capacitor can be increased especially without leading to an increase in processing time or reduction in aperture ratio.

The liquid crystal display device shown in the specification and drawings of the prior application will be described using FIG. 12 to FIG. 15. FIG. 12 is an enlarged plan view of a portion corresponding to a single pixel in the liquid crystal display device of the prior invention, viewed through a color filter substrate. FIG. 13 is a cross-sectional side view showing a structure along the cut line XIII-XIII of the liquid crystal display device shown in FIG. 12. In addition, FIG. 14A to FIG. 14G are cross-sectional views showing the process of manufacturing the array substrate illustrated in FIG. 12, and FIG. 15A to FIG. 15E are cross-sectional views showing the process subsequent to FIG. 14G of manufacturing the array substrate illustrated in FIG. 12. All of FIGS. 14 and 15 illustrate the cross-sectional views along the cut line XIII-XIII shown in FIG. 12.

The liquid crystal display device 10D of the prior application is made by bonding the outer circumferential surfaces of a pair of substrates, that is an array substrate 13 and a color filter substrate 14, with each other using a sealing material (omitted in the drawing), and then injecting liquid crystal 15 into the interior portion. The array substrate 13 has transparent substrates 11 and 12 made of glass or other, with various wiring lines, etc. formed thereon.

On the array substrate 13 and color filter substrate 14 (inner surface) there are formed various wiring lines and so on. The array substrate 13 is provided with multiple scan lines 16, signal lines 17, auxiliary capacitor lines 18, thin film transistors (TFTs), and pixel electrodes 20. The scan lines 16 and signal lines 17 are formed into a matrix. The auxiliary capacitor lines 18 are provided between the scan lines 16, parallel to the scan lines 16. The TFT is composed of a source electrode S, a gate electrode G, a drain electrode D, and a semiconductor layer 19 made of amorphous silicon (a-Si), etc. The pixel electrode 20 is provided so as to cover the area enclosed by the scan lines 16 and signal lines 17. In addition, a contact hole 30 is provided in the position corresponding to an auxiliary capacitor electrode 18a to form an electrical coupling between the pixel electrode 20 and drain electrode D. The structure of this portion will be described in detail below using FIG. 14 and FIG. 15.

On the color filter substrate 14 there are usually provided a black matrix 21, a color filter 22, and a common electrode 23. The black matrix 21 is provided in a matrix form aligned with pixel regions of the array substrate 13. The color filter 22 is composed of, for example, red (R), green (G), and blue (B), etc., provided in the area enclosed by the black matrix 21. The common electrode 23 is electrically coupled to the electrode on the array substrate 13 and provided so as to cover the color filter. In addition, in the area enclosed by the array substrate 13, color filter substrate 14, and sealing material, there are provided multiple columnar spacers, etc. as required to obtain uniform distances between the substrates, and the liquid crystal 15 is filled.

Next, the manufacturing process for the above-mentioned array substrate 13 of a liquid crystal display device 10D will be described below, with reference to FIG. 14 and FIG. 15. First, as shown in FIG. 14A, a conductive material layer 24 of a prescribed thickness made of aluminum, molybdenum, chromium, or their alloy is formed on the transparent substrate 11. Next, as shown in FIG. 14B, a part of the conductive material layer 24 is etched away by performing patterning using a commonly-known photolithography method, and then there are formed the scan lines 16 extending in the crosswise direction and the auxiliary capacitor lines 18 between these scan lines 16. In FIG. 14B there are shown the gate electrode G that extends from the scan line 16, and an auxiliary capacitor electrode 18a that is formed by widening a part of the auxiliary capacitor line 18. The scan line 16 and auxiliary capacitor line 18 are shown as wiring lines of a multilayer structure composed of aluminum and molybdenum. Although aluminum has the advantage of having a small resistance value, it has the disadvantages of being corrosion-prone and having a high contact resistance to ITO. These disadvantages can be improved by using a multilayer structure with aluminum covered by molybdenum.

Next, as shown in FIG. 14C, a thick insulating layer 25 of a prescribed thickness is formed so as to cover a transparent substrate 11 on which the scan lines 16 and auxiliary capacitor lines 18 have been formed in the preceding process. A transparent inorganic insulating material composed of silicon nitride, etc. is used as a material for the thick insulating layer 25. Because the thickness of the thick insulating layer 25 is related to the insulation performance of the scan line 16 and gate electrode G, it is preferable to be in the range of 2000 Å to 4500 Å, and more preferable to be 2800 Å or more. After that, as shown in FIG. 14D, only the portion of this thick insulating layer 25 directly above the auxiliary capacitor electrode 18a is etched away to form a window portion W.

After completion of the above-described process, a thinned insulating layer 26 is formed so as to cover a transparent substrate 11, as shown in FIG. 14E. Since the thinned insulating layer 26 is formed over the thick insulating layer 25 and the auxiliary capacitor electrode 18a, above which the thick insulating layer 25 is etched away, the scan line 16 and gate electrode G are coated with both the thick insulating layer 25 and the thinned insulating layer 26. Thus, this double-layered film constitutes a first insulating film (called also a gate insulating layer) 27 with a thickness of 2500 Å to 5500 Å. Here, the auxiliary capacitor electrode 18a is coated with only the thinned insulating layer 26. The material of the thinned insulating layer 26 may be either the same as that of the thick insulating layer 25, that is silicon nitride, or that of another insulating layer, for example silicon oxide. Its thickness needs only to be thinner than that of the thick insulating layer 25, preferably from 500 Å to 1500 Å, and more preferably approximately 1000 Å, for example from 800 Å to 1200 Å.

Next, as shown in FIG. 14F, on the thinned insulating layer 26 is formed a silicon layer, for example an a-Si layer, with a thickness of 1800 Å, and on its surface is formed an ohmic contact layer (not shown in the drawing) composed of an $n^+$a-Si layer to a thickness of 500 Å. Then, as shown in FIG. 14G, the a-Si layer and $n^+$a-Si layer are etched away, except the portion covering the gate electrode G, to form a semiconductor layer 19 that constitutes a part of TFT.

Then, using the same method as the above, a conductive material film is formed on the transparent substrate 11, and as shown in FIG. 15A, patterning is performed to form the signal lines 17 that extend in a direction perpendicular to the scan line 16, the source electrode S that is extended from the signal line 17 and coupled to the semiconductor layer 19, and the drain electrode D that covers over the auxiliary capacitor electrode 18a and has an end coupled to the semiconductor layer 19. In this way, the TFT serving as a switching element is formed in the neighborhood of the intersection between the scan line 16 and signal line 17 on the transparent substrate 11.

Furthermore, as shown in FIG. 15B, on the transparent substrate 11 so as to cover these wiring lines, a second insulating film (called also a protective insulating film, or passivation film) 28, which is made of inorganic insulating material to stabilize the surface, is formed. Then, as shown in FIG. 15C, an interlayer 29, which is made of organic insulating material to flatten the surface of the array substrate 13, is formed.

Next, as shown in FIG. 15D, the interlayer 29 and the second insulating film 28 are removed at a portion directly above the auxiliary capacitor electrode 18a of the interlayer 29, to form the contact hole 30. Finally, after this step, as shown in FIG. 15E, in each pixel region enclosed by the scan lines 16 and signal lines 17 is formed the pixel electrode 20 made of, for example, ITO or IZO. At this point, it is preferable to provide the pixel electrode 20 so that a part thereof is located on the scan line 16 and signal line 17, and the neighboring pixel electrodes 20 are not in contact with each other. With the above process, manufacture of the array substrate 13 is completed.

The auxiliary capacitor of the array substrate 13 formed by the above-described manufacturing method has a capacitor structure in which the lower electrode corresponds to the auxiliary capacitor electrode 18a, the upper electrode to the drain electrode D coupled to the pixel electrode 20, and the dielectric body to the thinned insulating layer 26. Therefore, since the layer functioning as the dielectric body is an insulating layer with a thickness of 500 Å to 1500 Å, which is thinner than the gate insulating film with the thickness of 2500 Å to 5500 Å functioning as the dielectric body in conventional technology, the capacitor capacitance can be dramatically increased. In addition, since the gate electrode G and scan lines 16 are coated with the first insulating film 27 having a double-layered structure with a thickness of 2500 Å to 5500 Å, which is constituted by the thick insulating layer 25 and the thinned insulating layer 26, the insulation performance is sufficiently ensured.

According to the liquid crystal display device 10D of the above-described prior invention, the capacitor capacitance is increased by reducing the thickness of the thinned insulating layer 26 acting as a dielectric body of a capacitor, enabling the size reduction of the electrode portion that constitutes the auxiliary capacitor. As a result, the aperture ratio of pixels can be increased. In addition, because the drain electrode D works also as an electrode constituting the auxiliary capacitor, the light-blocking portion in the pixel can be made smaller compared with the case in which, in addition to the drain electrode, a special electrode (conductive layer) is provided as an electrode constituting the auxiliary capacitor, thus producing the advantage of further improvement in aperture ratio.

However, according to the liquid crystal display device 10D of the above-described prior invention, the contact hole 30 is provided so as to lie directly above the auxiliary capacitor electrode 18a. The contact hole 30 is formed by etching the interlayer 29 and the second insulating film 28 lying over the drain electrode D, using a dry etching method (plasma etching method). In that case, the drain electrode is subject to pinholes by plasma damage. Moreover, because the thickness of the thinned insulating layer 26 lying under the drain electrode D is as thin as 500 Å to 1500 Å, the portion forming the contact hole 30 is prone to short-circuit between the drain electrode D and auxiliary capacitor electrode 18a, leading to the occurrence of bright point defects. This tendency has been causing the reduction in fabrication yield.

SUMMARY

As a result of various studies to solve the problems of the above prior invention, the present inventors have found that the problems can be solved, while adopting the same structure of an auxiliary capacity forming region as that of the above prior invention, by dislocating a contact hole forming position toward a first insulating film, which is thicker than an insulating layer of the auxiliary capacity forming region. This finding has led to the completion of the present invention.

An advantage of some aspects of the present invention is to provide a liquid crystal display device having pixels that have small pixel areas or that are made high-definition, in which bright point defects scarcely occur during manufacturing, the efficiency of a capacitor formed as an auxiliary capacity is further increased, and in addition, the defective display such as cross talk or flicker can be suppressed without increasing processing time and without reducing the aperture ratio of each pixel, as well as a method for manufacturing the same.

According to a first aspect of the present invention, a liquid crystal display device includes: a transparent substrate; multiple signal lines and multiple scan lines provided in a matrix on the transparent substrate; multiple auxiliary capacitor lines provided in between the scan lines in parallel with the scan lines; a thin film transistor including a source electrode, a gate electrode and a drain electrode provided near each intersection of the signal lines and the scan lines; and a pixel electrode provided in each area defined by the signal lines and the scan lines. The pixel electrode is electrically coupled to the drain electrode of the thin film transistor. The gate electrode of the thin film transistor, the scan lines, and the auxiliary capacitor lines are covered with a first insulating film, and a thinned insulating layer is formed as a part of the first insulating film on the auxiliary capacitor lines. The drain electrode is extended on the first insulating film so as to cover surfaces of a thick insulating layer and the thinned insulating layer of the first insulating film. A second insulating film is formed in between the pixel electrode and the drain electrode. A portion defining a contact hole is formed in the second insulating film positioned on the drain electrode on the thick insulating layer of the first insulating film. The pixel electrode and the drain electrode are electrically coupled via the contact hole.

In the above device, the contact hole may be positioned on the drain electrode formed on the thick insulating layer of the first insulating film on the auxiliary capacitor lines.

In the above device, the contact hole formed on the drain electrode on the thick insulating layer of the first insulating film may be positioned closer to the thin film transistor than to the thinned insulating layer.

In the above device, the thinned insulating layer of the first insulating film of a multi-layered structure may be an uppermost layer closest to the liquid crystal.

In the above device, the thinned insulating layer of the first insulating film of a multi-layered structure may be a layer formed closest to the transparent substrate.

In the above device, the thinned insulating layer of the first insulating film of a multi-layered structure may be the thinnest layer.

In the above device, edges of the thinned insulating layer on the auxiliary capacitor lines may be positioned further inside than edges of the auxiliary capacitor lines.

In the above device, edge portions of the auxiliary capacitor line may be covered with the first insulating film.

In the above device, the thickness of the first insulating film may be 2500 to 5500 Å and the thickness of the thinned insulating layer may be 500 to 1500 Å.

According to a second aspect of the present invention, a method for manufacturing a liquid crystal display includes: providing on a transparent substrate, multiple scan lines and multiple auxiliary capacitor lines so as to be parallel with each other; forming a first insulating film so as to cover the entire surface of the transparent substrate, and forming a thinned insulating layer as a part of the first insulating film on the auxiliary capacitor lines; forming a semiconductor layer on a surface of the first insulating film in a position corresponding to a gate electrode formed on a part of the scan lines; providing multiple signal lines each having a portion formed with a source electrode so as to intersect with the scan lines, and forming a drain electrode so as to cover surfaces of a thick insulating layer and the thinned insulating layer of the first insulating film; forming a second insulating film so as to cover the substrate surface mounted with the signal lines, the source electrode, and the drain electrode; forming a contact hole on the second insulating film positioned on the drain electrode on the thick insulating layer of the first insulating film; and forming a pixel electrode on the second insulating film so as to be electrically coupled with the drain electrode via the contact hole.

In the above method, the forming the thinned insulating layer may include: forming the first insulating film into multiple layers in multiple times; and removing at least one layer among the multiple layers.

In the above method, the forming the thinned insulating layer may include: removing a first-formed layer among the multiple layers of the first insulating film formed in multiple times.

By virtue of the above structure, the invention produces the following advantage. That is, according to a liquid crystal display device of some aspects of the invention, drain electrodes coupled to pixel electrodes are extended over a thinned insulating layer of a first insulating film that is provided on the surface of a part of auxiliary capacitor lines. Because the thickness of the thinned insulating layer is less than the thickness of the first insulating film covering the surrounding area of the auxiliary capacitor lines, and the thinned insulating layer forms the dielectric body layer of the auxiliary capacity, the auxiliary capacitance can be dramatically increased. Therefore, it is possible to obtain a liquid crystal display device that can suppress the defective display such as cross talk or flicker without enlarging the area of the auxiliary capacitor lines. The auxiliary capacitor line of some aspects of the present invention includes a widened portion, which is called an auxiliary capacitor electrode.

In other words, although the first insulating film is essentially provided with a uniform thickness all over the transparent substrate for the purpose of maintaining the insulation performance between layers, it is impossible to reduce the thickness of the first insulating film, which functions as a gate insulating layer to maintain the electrostatic withstand voltage of TFT, especially over the gate electrode as a TFT terminal. However, as in the liquid crystal display device of some aspects of the present invention, by forming a thinned insulating layer of the first insulating film on a part of the surface of the auxiliary capacitor line, the thinned insulating layer can be formed on the auxiliary capacitor line without specially thinning the whole of the first insulating film. Therefore, the above-described advantage can be produced without causing any adverse effect in other structures. In addition, because the auxiliary capacitor can be formed by extending the drain electrode on the thinned insulating layer, the light-blocking auxiliary capacitor can be efficiently arranged, thus improving the aperture ratio.

In addition, because the contact hole forming position is located directly above the drain electrode on the thick insulating layer of the first insulating film, when compared with the case when the contact hole is formed on the thinned insulating layer as in the prior invention, the thickness of the first insulating film is thicker than the thinned insulating layer, resulting in a reduction in the frequency of short-circuiting between the drain electrode and auxiliary capacitor electrode in the contact hole forming position. Thus, a liquid crystal display panel in which bright point defects scarcely occur during manufacturing can be obtained.

Moreover, according to the liquid crystal display device of some aspect of the invention, because the auxiliary capacitor line and drain electrode overlap with each other even in the position where the contact hole is formed, a capacity may be formed between the auxiliary capacitor line and drain electrode, though its capacitance is not so large as that of the thinned layer. In this way, the capacitance in a pixel can be further increased.

Also, according to the liquid crystal display device of some aspects of the invention, the contact hole may be formed in the position closer to the thin film transistor than is the portion where the capacity is formed by thinning of the layer. Accordingly, the delay of writing to the pixel electrode can be reduced. Also, according to some aspects of the invention, a very large auxiliary capacitance may be formed by thinning the first insulating film. Therefore, if the thinned layer is located closer to the thin film transistor than is the contact hole, capacity forming may precede the writing to the pixel electrode, leading to a delay in the writing. Accordingly, the present structure is very effective in reducing the delay of writing to the pixel electrode.

Also, according to the liquid crystal display device of some aspects of the invention, the above-described thin insulating layer may be easily formed by the following method. The first insulating film is made to have a multi-layered structure, and the thinned insulating layer over the auxiliary capacitor line is made to be composed of one layer of the multi-layer, that is, either the layer formed closest to the liquid crystal or the layer formed closest to the transparent substrate among the first insulating film. Then, for example, materials of different etching characteristics are used for individual layers of the first insulating film, and only unnecessary layers are etched away. By making the layer used as an insulating layer to be the thinnest of the layers in the first insulating film, the capacitance of the auxiliary capacitor can be easily increased.

Also, according to the liquid crystal display device of some aspects of the invention, because the edge of the thinned insulating layer on the auxiliary capacitor line may be located further inside than the edge of the auxiliary capacitor line. Accordingly, the capacitance of the auxiliary capacitor can be increased, while keeping a sufficient clearance between the scan line and the upper electrode that constitutes the auxiliary capacitor, and also while securing the electrostatic withstand voltage of the upper and lower electrodes, which constitute the auxiliary capacitor near the edge of the auxiliary capacitor line.

Also, according to the liquid crystal display device of some aspects of the invention, the thickness of the first insulating film may be kept from 2500 Å to 5500 Å, which do not impair the insulation performance, whereas the thinned insulating layer is as thin as 500 Å to 1500 Å. Therefore, the capacitance of the capacitor can be made large. It is preferable that the thickness of the first insulating film is 2800 Å or more, and more preferably, the thickness of the thinned insulating layer is approximately 1000 Å.

According to a method for manufacturing a liquid crystal display device of some aspects of the invention, the first insulating film may be formed into multiple layers in multiple times, and one layer among the multiple layers formed on the auxiliary capacitor line, that is the first-formed layer of the first insulating film, may be removed. Therefore, on a part of the surface of the auxiliary capacitor line, the thinned insulating layer, which is thinner than the first insulating film, can be easily formed.

BRIEF DESCRIPTION OF THE DRAWINGS

The invention will be described with reference to the accompanying drawings, wherein like numbers reference like elements.

FIG. 5A to FIG. 5E are cross-sectional views illustrating the processes for manufacturing an array substrate of the second embodiment.

FIG. 6A to FIG. 6D are cross-sectional views illustrating the process subsequent to FIG. 5E of manufacturing the array substrate of the second embodiment.

FIG. 8A to FIG. 8F are cross-sectional views illustrating the process subsequent to FIG. 7F of manufacturing the array substrate of the third embodiment.

FIG. 13 is a cross-sectional side view showing a structure along the cut line XIII-XIII of the liquid crystal display device shown in FIG. 12.

DESCRIPTION OF EXEMPLARY EMBODIMENTS

Exemplary embodiments of the invention will now be described with reference to the accompanying drawings. It should be borne in mind, however, that the following embodiments merely represent illustrative examples of a liquid crystal display device and manufacturing method therefor that realize the technical concepts of the invention. These embodiments are not intended to limit the invention to this particular liquid crystal display device and its manufacturing method. The invention can equally well be applied in other embodiments contained within the scope of the claims. The embodiments described below are directed to a transmission type liquid crystal display device. However, it is apparent that the liquid crystal display device of the present invention can be applied not only to the transmission type, but also to semi-transmission type and reflection type liquid crystal display devices.

First Embodiment

Figure 1:
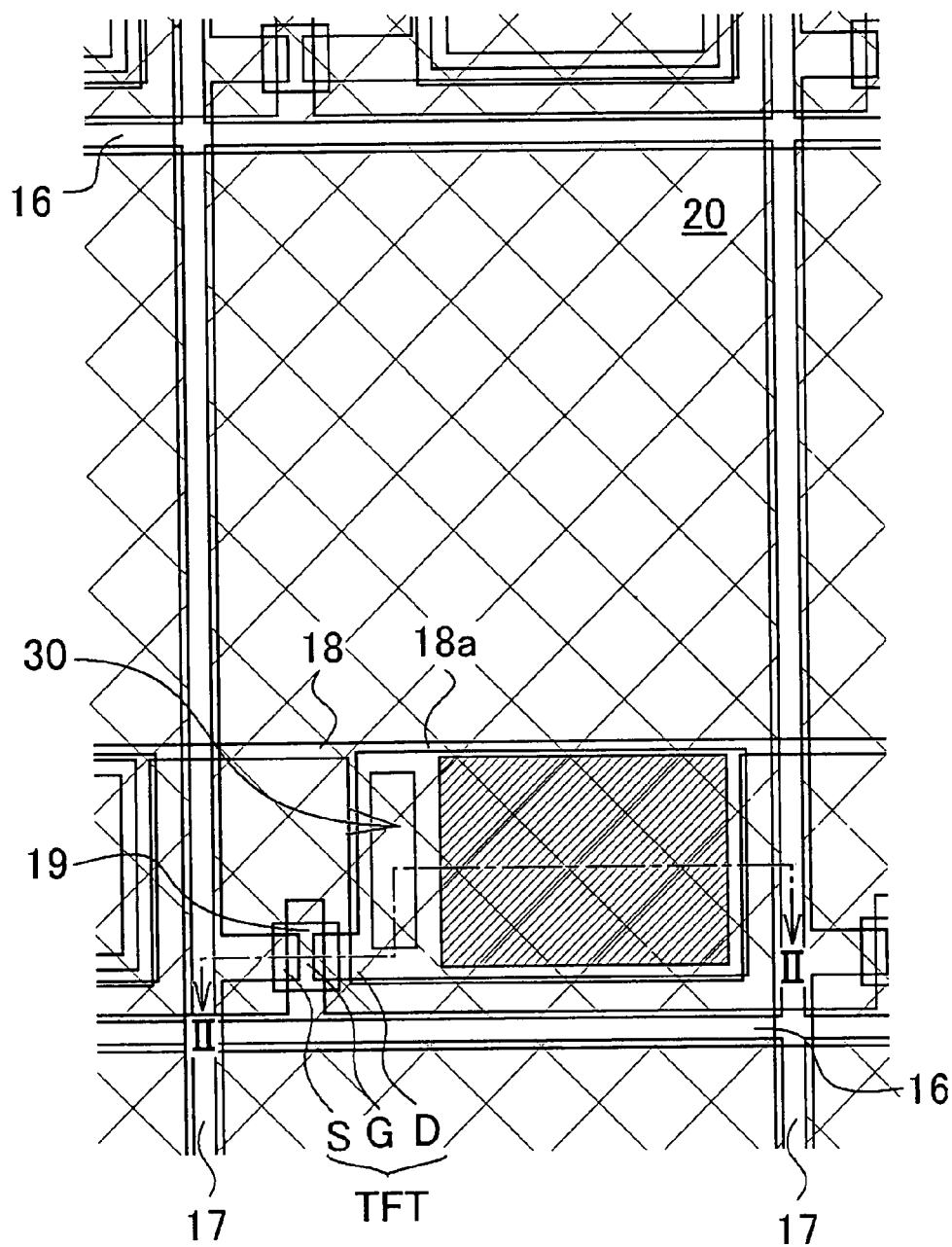
FIG. 1 is a plan view of a portion corresponding to a single pixel, enlarged and viewed through a color filter substrate, in a liquid crystal display device of the first embodiment of the invention.
Figure 2:
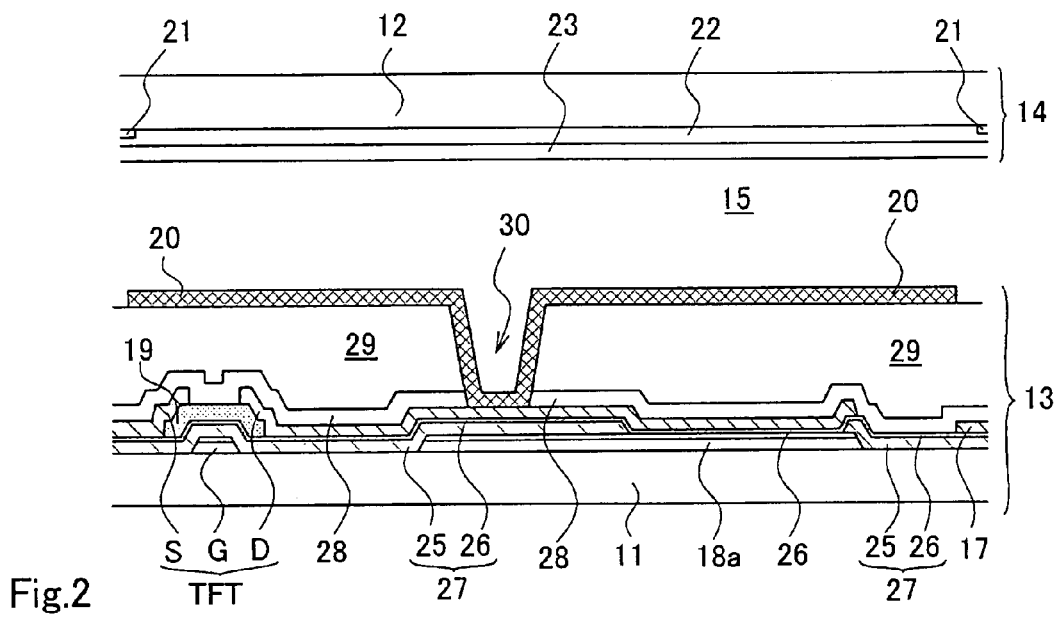
FIG. 2 is a cross-sectional side view showing a structure along the cut line II-II of the liquid crystal display device shown in FIG. 1.

FIG. 1 is a plan view of a portion corresponding to a single pixel, enlarged and viewed through other substrate, for example a color filter substrate, in a liquid crystal display device of the first embodiment of the invention. FIG. 2 is a cross-sectional side view showing a structure along the cut line II-II of the liquid crystal display device shown in FIG. 1. FIG. 3 and FIG. 4 are cross-sectional views illustrating the processes for manufacturing an array substrate of the liquid crystal display device shown in FIG. 1. All of FIGS. 3 and 4 illustrate the cross-sectional views along the cut line II-II shown in FIG. 1.

The liquid crystal display device 10A of the first embodiment is made by bonding the outer circumferential surfaces of a pair of substrates, that is an array substrate 13 and a color filter substrate 14, to each other with a sealing material (omitted in the drawing), and then injecting liquid crystal 15 into the interior portion. The array substrate 13 has transparent substrates 11 and 12 made of glass or other, with various wiring lines, etc. formed on them.

On the array substrate 13 and color filter substrate 14 (inner surface) there are formed various wiring lines and so on. The array substrate 13 is provided with scan lines 16, signal lines 17, auxiliary capacitor lines 18, auxiliary capacitor electrodes 18a, thin film transistors (TFTs), and pixel electrodes 20. The multiple scan lines 16 and signal lines 17 are formed into a matrix. The multiple auxiliary capacitor lines 18 are provided between the multiple scan lines 16, parallel to the scan lines 16. The TFT is composed of a gate electrode G, a source electrode S, a drain electrode D, and a semiconductor layer 19. The pixel electrode 20 is provided so as to cover the area enclosed by the scan lines 16 and signal lines 17.

The gate electrode G of the TFT is coupled to the scan lines 16, and the source electrode S is coupled to the signal lines 17. Polysilicon (p-Si) or amorphous silicon (a-Si) is usually used for the semiconductor layer 19 of the TFT. However, not only them but also any active element can be used. The liquid crystal display panel 10A of the first embodiment is characterized by the structure of the auxiliary capacitor electrode 18a and the position where a contact hole 30 is formed. Their specific structures will be described using FIG. 3 and FIG. 4, which illustrate the manufacturing process for the array substrate 13.

On the color filter substrate 14 there are usually provided a black matrix 21, a color filter 22, and a common electrode 23. The black matrix 21 is provided in a matrix form aligned with pixel regions of the array substrate 13. The color filter 22 is composed of red (R), green (G), and blue (B), etc., provided in the area enclosed by the black matrix 21. The common electrode 23 is electrically coupled to the electrode on the array substrate and provided so as to cover the color filter. However, the invention is not limited to this constitution.

Some in-plane switching systems may have no common electrode. Black-and-white displays have no color filters. Complementary-color type color displays may be composed not of color filters of three primary colors, but of larger variety of color filters.

In addition, in the area enclosed by the array substrate 13, color filter substrate 14, and sealing material, there are provided multiple columnar spacers, etc. as required to obtain uniform distances between the substrates, and the liquid crystal 15 is filled.

Figure 3A:
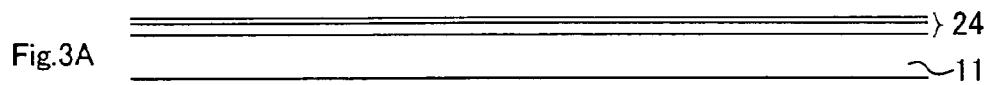
FIG. 3A to FIG. 3G are cross-sectional views illustrating the processes for manufacturing an array substrate of FIG. 1.
Figure 3B:
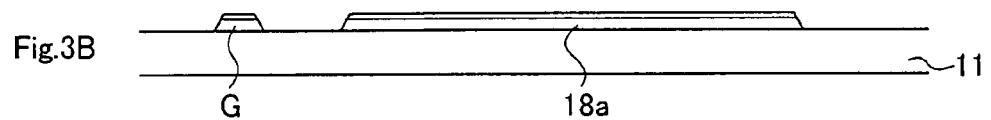

Next, the manufacturing process for the above-mentioned array substrate 13 of the liquid crystal display device 10A will be described below, with reference to FIG. 3 and FIG. 4. First, as shown in FIG. 3A, a conductive material layer 24 of a prescribed thickness made of aluminum, molybdenum, chromium, or their alloy is formed on the transparent substrate 11. Next, as shown in FIG. 3B, part of the conductive material layer 24 is etched away by performing patterning using a commonly-known photolithography method, and then there are formed the multiple scan lines 16 extending in the crosswise direction and the auxiliary capacitor lines 18 between these multiple scan lines 16. In FIG. 3B there are shown the gate electrode G that extends from a scan line 16, and the auxiliary capacitor electrode 18a that is formed by widening a part of the auxiliary capacitor line 18. The scan line 16 and auxiliary capacitor line 18 are shown there as wiring lines of a multilayer structure composed of aluminum and molybdenum. Although aluminum has the advantage of having a small resistance value, it has the disadvantages of being corrosion-prone and having a high contact resistance to ITO. These disadvantages can be improved by using a multilayer structure with aluminum covered by molybdenum.

Figure 3C:
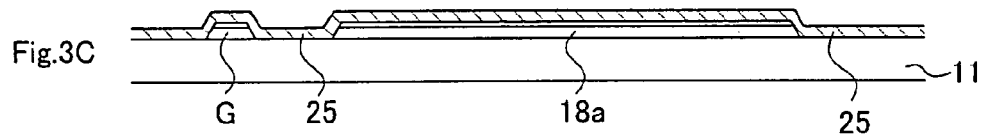
Figure 3D:
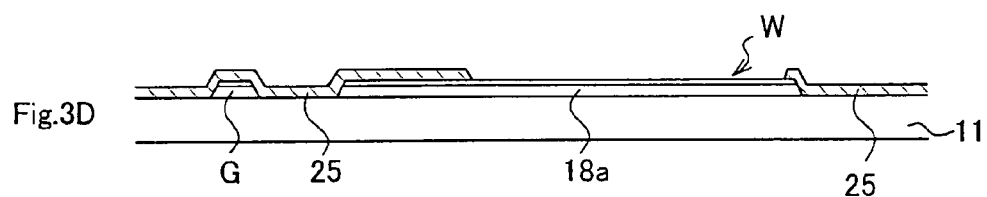

Next, as shown in FIG. 3C, a thick insulating layer 25 of a prescribed thickness is formed so as to cover the transparent substrate 11 on which the scan lines 16 and auxiliary capacitor lines 18 have been formed in the preceding process. A transparent inorganic insulating material composed of silicon nitride, etc. is used as a material for the thick insulating layer 25. Because the thickness of the thick insulating layer 25 is related to the insulation performance of the scan line 16 and gate electrode G, it is preferable to be in the range of 2000 Å to 4500 Å, and more preferable to be 2800 Å or more. After that, as shown in FIG. 3D, a part of the portion of this thick insulating layer 25 above the auxiliary capacitor electrode 18a, that is the portion on the side apart from the drain electrode D, is etched away to form a window portion W.

Figure 3E:
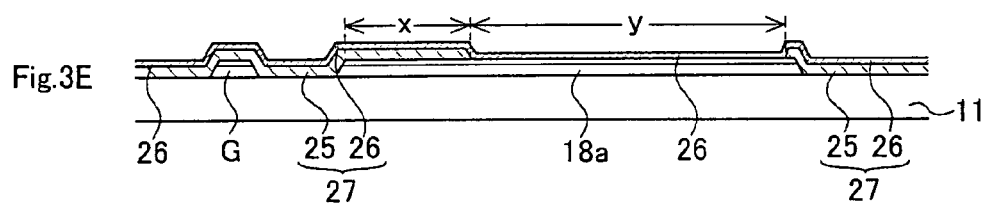

Then, after completion of the above-described process, a thinned insulating layer 26, which is thinner than the thick insulating layer 25, is formed so as to cover the transparent substrate 11, as shown in FIG. 3E. Since the thinned insulating layer 26 is formed over the thick insulating layer 25 and the auxiliary capacitor electrode 18a, above which the thick insulating layer 25 is etched away, the scan line 16 and gate electrode G are coated with both the thick insulating layer 25 and the thinned insulating layer 26. Thus, this double-layered film constitutes a first insulating film 27 that function as a gate insulating film with a thickness of 2500 Å to 5500 Å.

On the auxiliary capacitor electrode 18a are also formed a region x, which is coated with the first insulating film 27 composed of two layers of the thick insulating layer 25 and thinned insulating layer 26, and an auxiliary capacity forming region y, which is coated with only the thinned insulating layer 26. In this case, the region x is formed on the side closer to the TFT than is the auxiliary capacity forming region y. In other words, because the contact hole 30 is closer to the TFT than is the auxiliary capacity forming region y, the delay in writing to the pixel electrode 20 via the contact hole 30 can be reduced. The material of the thinned insulating layer 26 may be either the same as that of the thick insulating layer 25, that is silicon nitride, or that of another insulating layer, for example silicon oxide. Its thickness is made to be thinner than that of the thick insulating layer 25, preferably from 500 Å to 1500 Å, and more preferably approximately 1000 Å, for example from 800 Å to 1200 Å.

The purpose of providing the insulating layer on the auxiliary capacitor electrode 18a is to, while securing the thickness of the region x of the auxiliary capacitor electrode 18a as the first insulating film 27, forming an insulating layer that is thinner than the first insulating film 27 in the auxiliary capacity forming region y of the auxiliary capacitor electrode 18a. Therefore, it may be possible to specially form the thinned insulating layer 26. However, an efficient way is to form the first insulating film 27 with, for example, 2 to 5 layers, and compose the thinned insulating layer 26 with at least one of the layers. In this way, the thinned insulating layer 26 having a good layer quality is obtained. In that case, a layer formed on the surface of the first insulating film 27 can form the thinned insulating layer 26 by changing the etching characteristics such as changing the film quality. The most efficient way is to form the thinned insulating layer 26 with a layer formed on the surface side of the first insulating film 27, in a similar way to the above in which the thick insulating layer 25 is formed and etched away to the surface of the auxiliary capacitor electrode 18a, and the thinned insulating layer 26 is formed on it. In this way, the thinned insulating layer 26 can be composed of the thinnest layer of the multiple layers constituting the first insulating film 27, thus making the auxiliary capacitance remarkably large.

Figure 3F:
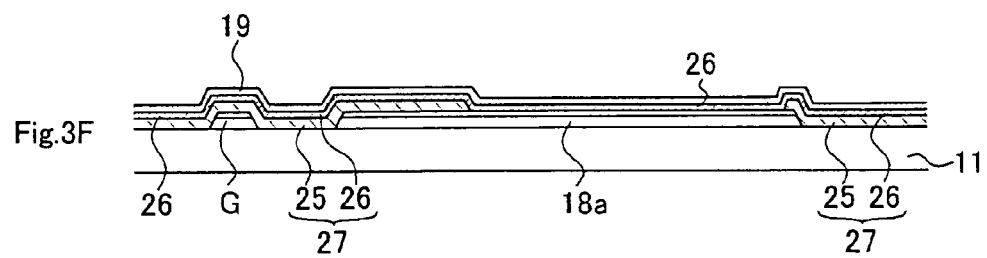
Figure 3G:
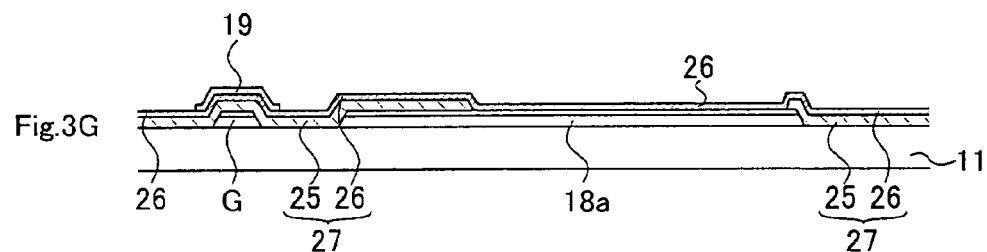

Next, as shown in FIG. 3F, on the first insulating film 27 including the thinned insulating layer 26 is formed the semiconductor layer 19, which is composed of an a-Si layer and $n^+$a-Si layer, with prescribed thicknesses (for example, 1800 Å for a-Si layer and 500 Å for $n^+$a-Si layer). Then, as shown in FIG. 3G, the semiconductor layer 19 is etched away, except the portion covering the gate electrode G, to form the semiconductor layer 19 that constitutes a part of TFT.

Figure 4A:
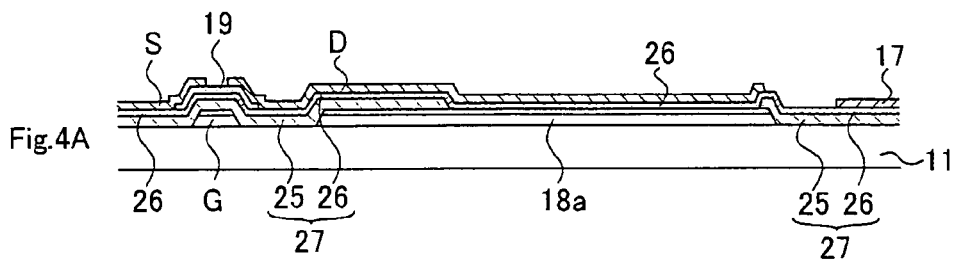
FIG. 4A to FIG. 4E are cross-sectional views illustrating the process subsequent to FIG. 3G of manufacturing the array substrate of FIG. 1.

Then, after forming a conductive material layer on the transparent substrate 11, part of the conductive material layer is etched away by performing patterning using a photolithography method. Then, as shown in FIG. 4A, the multiple signal lines 17, which extend in a direction perpendicular to the scan lines 16, and the source electrode S, which is extended from the signal lines 17 and coupled to the semiconductor layer 19, are formed. Also the drain electrode D is formed so that, at one end, it is coupled to the semiconductor layer 19, and at the other end, it is extended on the first insulating film 27 lying on the auxiliary capacitor electrode 18a, to coat the thinned insulating layer 26. In this way, the TFT serving as a switching element is formed in the near of the intersection between the scan line 16 and signal line 17 on the transparent substrate 11.

Figure 4B:
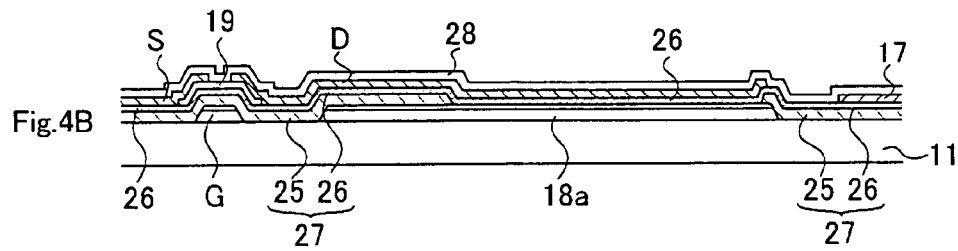
Figure 4C:
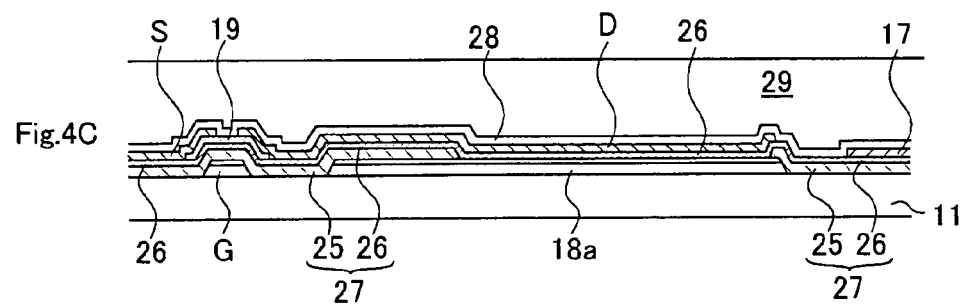
Figure 4D:
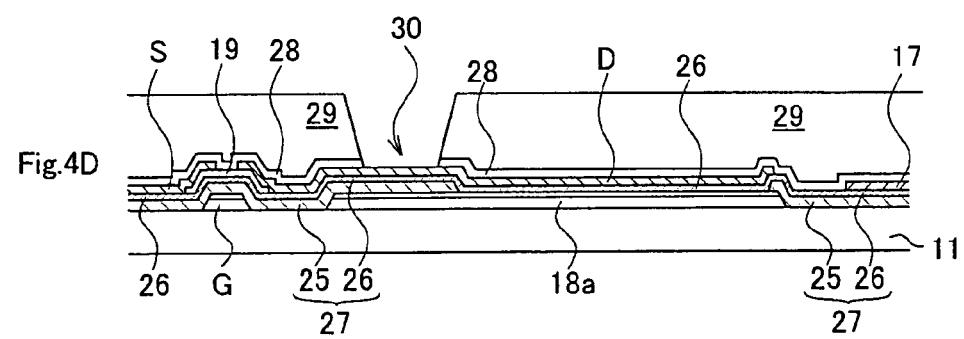

Furthermore, as shown in FIG. 4B, on the transparent substrate 11 so as to cover these wiring lines, a second insulating film 28, which is made of inorganic insulating material to stabilize the surface, is formed. Next, as shown in FIG. 4C, an interlayer 29, which is made of organic insulating material to flatten the surface of the array substrate 13, is formed. Then, as shown in FIG. 4D, using a plasma etching method, the contact hole 30 is formed to the interlayer 29 and second insulating film 28, which are formed on the drain electrode D, at the position of the region x (refer to FIG. 3E) on the auxiliary capacitor electrode 18a.

When the contact hole 30 is formed, short-circuiting does not occur between the drain electrode D and auxiliary capacitor electrode 18a in the portion where the contact hole 30 is formed, because the first insulating film 27, which is composed of two layers of both the thick insulating layer 25 and the thinned insulating layer 26, lies under the drain electrode D located in the region x. In addition, because the position where the contact hole 30 is formed is located above the auxiliary capacitor electrode 18a, which is made of light-blocking material, variation in display quality, which is caused by the difference in the inter-substrate distance from other portions occurring when the array substrate 13 is bonded with the color filter substrate 14 to produce the liquid crystal display device 10A, becomes unnoticeable. Because the first insulating film 27 is interposed between the auxiliary capacitor electrode 18a and drain electrode D also in the region x, a capacity is formed also in the region x. Accordingly, the auxiliary capacitance in a single pixel can be increased. However, the position of the contact hole 30 need not be above the auxiliary capacitor electrode 18a. When the position of the contact hole 30 is not above the auxiliary capacitor electrode 18a, the short circuit between the drain electrode D and auxiliary capacitor electrode 18a accompanying the formation of the contact hole 30 can be securely avoided.

Figure 4E:
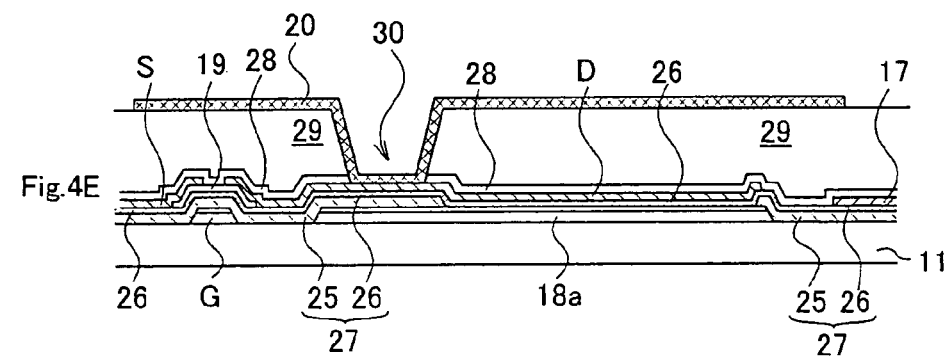

Finally, as shown in FIG. 4E, in each pixel region enclosed by the scan lines 16 and signal lines 17 is formed the pixel electrode 20 made of, for example, ITO. At this point, it is preferable to provide the pixel electrode 20 so that a part thereof is located on the scan line 16 and signal line 17, and the neighboring pixel electrodes 20 are not in contact with each other. With the above process, manufacture of the array substrate 13 is completed.

The auxiliary capacitor of the array substrate 13 formed by the above-described manufacturing method has a capacitor structure in which the lower electrode corresponds to the auxiliary capacitor electrode 18a, the upper electrode to the drain electrode D coupled to the pixel electrode 20, and the dielectric body to the thinned insulating layer 26 with a thickness of 500 Å to 1500 Å. Therefore, because the dielectric body is composed of the thinned insulating layer 26, which is thinner than the gate insulating film having the thickness of 2500 Å to 4500 Å of the conventional technology, the auxiliary capacitance can be dramatically increased compared with that of conventional technology. In addition, because the gate electrode G, scan lines 16, and the position where the contact hole 30 is formed are coated with the first insulating film 27 having a multi-layered structure, which is composed of the thick insulating layer 25 and the thinned insulating layer 26, the insulation performance is sufficiently ensured, and thus the liquid crystal display panel 10A with only a small number of bright point defects is obtained.

In addition, because the auxiliary capacitance is increased, the size of the electrode portion that constitutes the auxiliary capacitor is reduced, and thus the aperture ratio of pixels can be increased. Furthermore, because the drain electrode D works also as an electrode constituting the auxiliary capacitor, the light-blocking portion in the pixel can be made smaller compared with the case in which, in addition to the drain electrode, a special electrode (conductive layer) is provided as an electrode of the auxiliary capacitor, thus producing a further improvement in aperture ratio.

In order to increase the capacitance of the auxiliary capacitor, it is preferable to make the insulating film thinner at all portions forming the auxiliary capacity. In the first embodiment, because the thinned insulating layer 26 is obtained in the auxiliary capacitor by removing a part of the thick insulating layer 25, in order to simply increasing the auxiliary capacitance, the removal area of the thick insulating layer 25 is made larger than the auxiliary capacitor electrode 18a. In other words, the goal can be achieved by locating the edge of the window portion W of the thick insulating layer 25 outside of the edge of the auxiliary capacitor electrode 18.

However, in the case that the drain electrode D serves also as an upper electrode of the auxiliary capacitor, the auxiliary capacitor is placed in the neighborhood of the scan line 16. As a result, if the thinned insulating layer 26 is made thin up to the outside of the auxiliary capacitor portion, the distance between the upper electrode of the auxiliary capacitor (drain electrode D) and scan line 16 become too small, causing problems such as a parasitic capacitance. Therefore, in the case that the drain electrode D serves also as the upper electrode of the auxiliary capacitor, the thinned insulating layer 26 needs to be made thin in the auxiliary capacitor portion, while keeping the distance between the upper electrode of the auxiliary capacitor and scan line 16 large, and the edge of the thinned insulating layer 26 needs to be located inside of the edge of the auxiliary capacitor electrode 18a.

In addition, because the thinned insulating layer 26 formed on the auxiliary capacitor electrode 18a tends to be thinner in the neighborhood of the edge of the auxiliary capacitor electrode 18a than in other layers, the insulating layer in the neighborhood of the edge of the auxiliary capacitor electrode 18a should preferably be thicker than the thinned insulating layer 26 near the center of the auxiliary capacitor electrode 18a, for the purpose of securing the electrostatic withstand voltage between the auxiliary capacitor electrode 18a and the upper electrode near the edge of the auxiliary capacitor electrode 18a as well. In the first embodiment, by locating the edge of the portion from which the thick insulating layer 25 is removed (window portion W) inside of the auxiliary capacitor electrode 18a, a sufficient clearance is secured between the upper electrode of the auxiliary capacitor (drain electrode D) and the scan line 16, and also the electrostatic withstand voltage is secured between the upper electrode and auxiliary capacitor electrode.

In the first embodiment, as a method for making the thinned insulating layer 26 thinner in the auxiliary capacitor portion, the thick insulating layer 25 is first formed, then a portion of the thick insulating layer 25 corresponding to the auxiliary capacitor electrode 18a is completely removed, and finally over it, the thinned insulating layer 26 made thinner than the thick insulating layer 25 is deposited. As another method for making the thinned insulating layer 26 thinner in the auxiliary capacitor portion, a rather thick insulating layer can be formed first, and then the insulating layer can be thinned by partly etching it. However, the first embodiment can control the thickness of the thinned insulating layer 26 in the auxiliary capacitor portion more easily, thus enabling the formation of the thinned insulating layer 26 with a uniform thickness.

As described above, according to a liquid crystal display of the first embodiment, because the position where a contact hole 30 is formed is located in the region x, which is coated with the first insulating film 27 composed of two layers of both the thick insulating layer 25 above the auxiliary capacitor electrode 18a and the thinned insulating layer 26, short-circuiting does not occur between the drain electrode D and auxiliary capacitor electrode 18a in the portion where the contact hole 30 is formed. In addition, because the capacitance of the auxiliary capacitor can be increased without enlarging the area of the auxiliary capacitor electrode made of light-blocking material, and also because the pixel electrode 20 is provided so that a part thereof is located on the scan line 16 and signal line 17, and the neighboring pixel electrodes 20 are not in contact with each other, the defective display such as cross talk or flicker can be suppressed without a reduction in the aperture ratio of each pixel. In addition, because the pixel electrodes 20 are provided on the flat interlayer 29, cell gaps of the resultant liquid crystal display device 10 can be made uniform, thus producing the liquid crystal display device 10 with a good display quality.

In the case that the liquid crystal display device 10A of the first embodiment is of a semi-transmission type rather than a transmission type, it is effective to form a fine surface irregularity partly on the surface of the interlayer 29 that is formed in the region of the pixel electrode outside the contact hole 30, and also form a reflective film made of light-reflective material either between the irregular portion and pixel electrode 20 or on the surface of the pixel electrode 20. Because a liquid crystal display device of semi-transmission type has a smaller area of transmissive portion than that of transmission type, the liquid crystal display device and its manufacturing method of the present invention, which can provide a wide area of opening portion, is particularly effective. When the liquid crystal display device is intended to be of a reflection type, it is effective to form a reflective film between the interlayer 29 and the pixel electrodes 20, or all over the surface of the pixel electrodes 20.

Second Embodiment

Next, the process of manufacturing an array substrate of a liquid crystal display device 10B according to a second embodiment of the invention will be described using FIG. 5 and FIG. 6. The enlarged plan view corresponding to a single pixel of the array substrate shown as a view through a color filter substrate of the liquid crystal display device 10B according to the second embodiment is the same as that of FIG. 1 shown in the case of the liquid crystal display device 10A according to the first embodiment. Similarly, the drawing of the array substrate of the second embodiment corresponding to the cross-sectional view II-II of FIG. 1 is the same as that of FIG. 2 shown in the case of the liquid crystal display device 10A according to the first embodiment. Accordingly, FIG. 1 and FIG. 2 are used as references for description as required, and the same parts as those constituting the liquid crystal display device 10A of the first embodiment are given the same reference marks. FIG. 5A, FIG. 5B, and FIGS. 6A to 6D are cross-sectional views illustrating the process of manufacturing the array substrate of the liquid crystal display device 10B according to the second embodiment. All of FIGS. 5A to 5E, and FIGS. 6A to 6D illustrate the states at the position corresponding to the cross-section II-II in FIG. 1.

First, as shown in FIG. 5A, a conductive material layer 24 of a prescribed thickness made of aluminum, molybdenum, chromium, or their alloy is formed on the transparent substrate 11. Next, as shown in FIG. 5B, part of the conductive material layer 24 is etched away by performing patterning using a commonly-known photolithography method, and then there are formed the multiple scan lines 16 extending in the crosswise direction, the gate electrodes G linked to the scan lines 16, and the auxiliary capacitor lines 18 between these multiple scan lines 16. In FIG. 5B there are shown the gate electrode G that extends from a scan line 16, and the auxiliary capacitor electrode 18a that is formed by widening a part of the auxiliary capacitor line 18.

Next, as shown in FIG. 5C, the transparent substrate 11, on which the scan lines 16 and auxiliary capacitor lines 18 have been formed in the preceding process, is heated in a vacuum device to a high temperature, for example to 350° C., and on its surface the thinned insulating layer 26 made of silicon nitride is formed with a prescribed thickness (for example 1000 Å) using a plasma CVD (Chemical Vapor Deposition) or other method, according to an ordinary procedure. Then, the temperature of the transparent substrate 11, on whose surface the thinned insulating layer 26 is formed, is reduced to a temperature lower than the first temperature, for example to 250° C., and the thick insulating layer 25 of silicon nitride is formed with a prescribed thickness (for example 3000 Å), similarly using a plasma CVD or other method. The two layers of the thinned insulating layer 26 and thick insulating layer 25 form the first insulating film 27. Furthermore, all over the surface of the thick insulating layer 25, the semiconductor layer 19, which is composed of, for example, an a-Si layer and $n^+$a-Si layer, is formed with prescribed thicknesses (for example, 1800 Å for a-Si layer and 500 Å for $n^+$a-Si layer).

All of the thinned insulating layer 26, thick insulating layer 25, and semiconductor layer 19 can be formed continuously, without taking the transparent substrate 11 out of the vacuum device. Because the thinned insulating layer 26 and thick insulating layer 25 are different in their substrate temperature when the insulating layer is formed, their layer hardness are different from each other even though they are made of the same material of silicon nitride. That is, because the thinned insulating layer 26 is harder due to its higher substrate temperature, the wet etching rate by buffered hydrofluoric acid is reduced. The thickness of the thinned insulating layer 26 should preferably be thin unless a short circuit does not occur, and it is recommended to be from 500 Å to 1500 Å. The thickness of the first insulating film 27, which is a combination of the thinned insulating layer 26 and thick insulating layer 25, should preferably be from 2500 Å to 5500 Å, to avoid dielectric breakdown by static electricity at the gate electrode G portion of the TFT.

In the above method, the insulating layers of different etching rates are formed by changing the substrate temperature when the insulating layers are stacked. As another method, different compositions of the ambient gas may be used to form the insulating layers of different etching rates. For example, silane gas and nitrogen gas are used for forming silicon nitride. In this case, by making the ratio of silane gas larger when forming the second layer than when the first layer is formed, the first insulating layer can be made harder.

After that, as shown in FIG. 5D, the semiconductor layer 19 is removed so as to remain unremoved on the surface of the gate electrode G of the TFT, using a dry etching method, and then the thick insulating layer 25 on the surface of the auxiliary capacitor electrode 18a is removed so that the thinned insulating film layer 26 becomes exposed, by wet etching using buffered hydrofluoric acid or by dry etching, to form the window portion W. In this process, because the etching rate of the thinned insulating layer 26 is smaller than that of the thick insulating layer 25, the thinned insulating layer 26 can remain practically unetched.

Next, after the conductive material layer made of aluminum, molybdenum, chromium, or their alloy has been formed on the transparent substrate 11, patterning is performed to form the multiple signal lines 17 that extend in a direction perpendicular to the scan line 16, the source electrode S that is extended from the signal line 17 and coupled to the semiconductor layer 19, and the drain electrode D that covers over the auxiliary capacitor electrode 18a and has one end coupled to the semiconductor layer 19, as shown in FIG. 1 and FIG. 5E. In this way, the TFT serving as a switching element is formed in the neighborhood of the intersection between the scan line 16 and signal line 17 on the transparent substrate 11.

Furthermore, as shown in FIG. 6A, on the transparent substrate 11 so as to cover these wiring lines, a second insulating film 28, which is made of inorganic insulating material (for example, silicon nitride) to stabilize the surface, is formed. Next, as shown in FIG. 6B, an interlayer 29, which is made of organic insulating material, such as polyimide, to flatten the surface of the array substrate 13, is formed. Then, as shown in FIG. 6C, using a plasma etching method, the contact hole 30 is formed to the interlayer 29 and second insulating film 28, which are formed on the drain electrode D, at the position of the region x (refer to FIG. 3E) on the auxiliary capacitor electrode 18a.

In this case also, because the region x is formed on the side closer to the TFT than is the auxiliary capacity forming region y, that is, because the contact hole 30 is closer to the TFT than is the auxiliary capacity forming region y, the delay in writing to the pixel electrode 20 via the contact hole 30 can be reduced. When the contact hole 30 is formed, short-circuiting does not occur between the drain electrode D and auxiliary capacitor electrode 18a in the portion where the contact hole 30 is formed, because the thick first insulating film 27, which is composed of two layers of both the thick insulating layer 25 and the thinned insulating layer 26, lies under the drain electrode D located in the region x. For the same reason, a capacity is formed also in the region x, resulting in an increase of capacitance in a single pixel. In addition, because the position where the contact hole 30 is formed is located above the auxiliary capacitor electrode 18a, which is made of light-blocking material, the variation in display quality, which is caused by the difference in the inter-substrate distance from other portions occurring when the array substrate 13 is bonded with the color filter substrate 14 to produce the liquid crystal display device 10B, becomes unnoticeable.

Then, as shown in FIG. 6D, in each pixel region enclosed by the scan lines 16 and signal lines 17 is formed the pixel electrode 20 made of, for example, ITO. At this point, for the prevention of light leakage, it is preferable to provide the pixel electrode 20 so that a part thereof is located on the scan line 16 and signal line 17, and the neighboring pixel electrodes 20 are not in contact with each other. With the above process, manufacture of the array substrate 13 is completed.

Similarly to the previously described case of the liquid crystal display device 10A according to the first embodiment of the invention, the auxiliary capacitor, which has been formed by the above-described manufacturing method, of the array substrate 13 of the liquid crystal display device 10B according to the second embodiment of the invention has a capacitor structure in which the lower electrode corresponds to the auxiliary capacitor electrode 18a, the upper electrode to the drain electrode D coupled to the pixel electrode 20, and the dielectric body to the thinned insulating layer 26 with a thickness of 500 Å to 1500 Å. Therefore, because the dielectric body is composed of the thinned insulating layer 26, which is thinner than the gate insulating film with the thickness of 2500 Å to 4500 Å of conventional technology, the auxiliary capacitance can be dramatically increased compared with that of conventional technology. In addition, because the gate electrode G, scan lines 16, and the position where the contact hole 30 is formed are coated with the first insulating film 27 having a multi-layered structure, which is composed of the thick insulating layer 25 and the thinned insulating layer 26, the insulation performance is sufficiently ensured, and thus the liquid crystal display panel 10B with only a small number of bright point defects is obtained.

Whereas the above-described second embodiment is shown as an example in which the thinned insulating layer 26 and thick insulating layer 25 are made of silicon nitride, both of them may be formed of silicon oxide, or either one of them may be formed of silicon oxide while the other is of silicon nitride. However, it should be noted that the uppermost layer should preferably be a layer with a high etching rate, and the thinned insulating layer 26 should be made of silicon nitride, from the viewpoint of insulating performance. In addition, the auxiliary capacitor line may be formed of aluminum, and anodizing its surface thereby converting to aluminum oxide, the resultant layer may be rendered to be the thinned insulating layer 26 of the auxiliary capacitor portion.

Third Embodiment

Next, the process of manufacturing an array substrate of a liquid crystal display device 10C according to a third embodiment of the invention will be described using FIG. 7 and FIG. 8. The enlarged plan view corresponding to a single pixel of the array substrate shown as a view through the color filter substrate of the liquid crystal display device 10C according to the third embodiment is the same as that of FIG. 1 shown in the case of the liquid crystal display device 10 according to the first embodiment. Similarly, the drawing of the array substrate of the third embodiment corresponding to the cross-sectional view II-II of FIG. 1 is the same as that of FIG. 2 shown in the case of the liquid crystal display device 10A according to the first embodiment. Accordingly, FIG. 1 and FIG. 2 are used as references for description as required, and the same parts as those constituting the liquid crystal display device 10A of the first embodiment are given the same reference marks. FIGS. 7A to 7F, and FIGS. 8A to 8F are cross-sectional views illustrating the process of manufacturing the array substrate of the liquid crystal display device 10C according to the third embodiment. All of FIGS. 7A to 7F, and FIGS. 8A to 8F illustrate the states at the position corresponding to the cross-section II-II in FIG. 1.

Figure 7A:
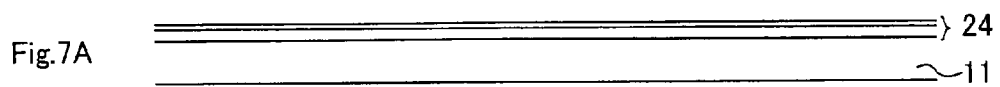
FIG. 7A to FIG. 7F are cross-sectional views illustrating the processes for manufacturing an array substrate of the third embodiment.
Figure 7B:
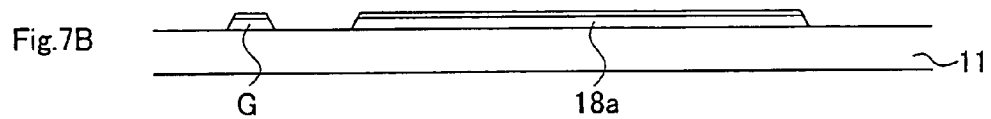

First, as shown in FIG. 7A, a conductive material layer 24 of a prescribed thickness made of aluminum, molybdenum, chromium, or their alloy is formed on the transparent substrate 11. Next, as shown in FIG. 7B, part of the conductive material layer 24 is etched away by performing patterning using a commonly-known photolithography method, and then there are formed the multiple scan lines 16 extending in the crosswise direction, the gate electrodes G linked to the scan lines 16, and the auxiliary capacitor lines 18 between these multiple scan lines 16. In FIG. 7B there are shown the gate electrode G that extends from a scan line 16, and the auxiliary capacitor electrode 18a that is formed by widening a part of the auxiliary capacitor line 18. The scan lines 16 and auxiliary capacitor lines 18 shown here have a multi-layered structure of aluminum and molybdenum, in order to make a junction contact with the pixel electrodes.

Figure 7C:
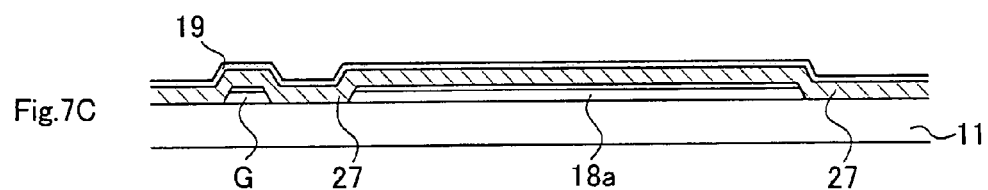

Next, as shown in FIG. 7C, on the surface of the transparent substrate 11, on which the scan lines 16 and auxiliary capacitor lines 18 have been formed in the preceding process, the first insulating film 27 of silicon nitride is formed with a prescribed thickness (for example 4500 Å), using a plasma CVD or other method, according to an ordinary procedure. In addition, all over the surface of the first insulating film 27, the semiconductor layer 19, which is composed of, for example, an a-Si layer and n$^+$a-Si layer, is formed with prescribed thicknesses (for example, 1800 Å for a-Si layer and 500 Å for n$^+$a-Si layer). Both of the first insulating film 27 and semiconductor layer 19 can be formed continuously, without taking the transparent substrate 11 out of the vacuum device. The thickness of the first insulating film 27 should preferably be from 2500 Å to 5500 Å, to avoid dielectric breakdown by static electricity at the gate electrode G portion of the TFT.

Figure 7D:
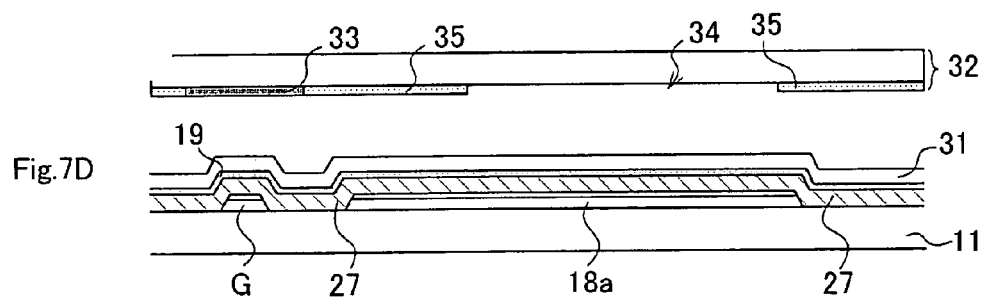
Figure 7E:
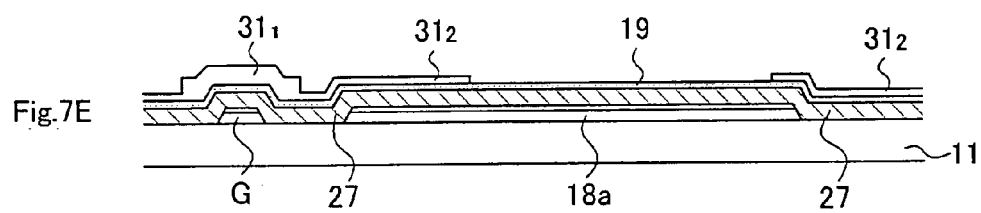

Then, as shown in FIG. 7D, a positive photoresist 31 is provided all over the surface of the transparent substrate 11 with a uniform thickness, and positive photoresist 31 is exposed to light through a half-tone mask 32. The half-tone mask 32 is composed of a completely light-blocking portion 33, which corresponds to the gate electrode G of the TFT, a light-transmissive portion 34, which corresponds to the auxiliary capacity forming region y of the auxiliary capacitor electrode 18a (refer to FIG. 3E), and a semi-transmissive portion 35 covering the rest of the half-tone mask 32. Therefore, when the photoresist 31 is developed after being exposed to light, a thick photoresist $31_1$ remains on the surface of the gate electrode G, the semiconductor layer 19 becomes exposed with no photoresist on the surface of the auxiliary capacity forming region y of the auxiliary capacitor electrode 18a, and a photoresist $31_2$, which is thinner than the photoresist $31_1$ on the surface of the gate electrode G, remains on the rest of the surface, as shown in FIG. 7E.

Figure 7F:
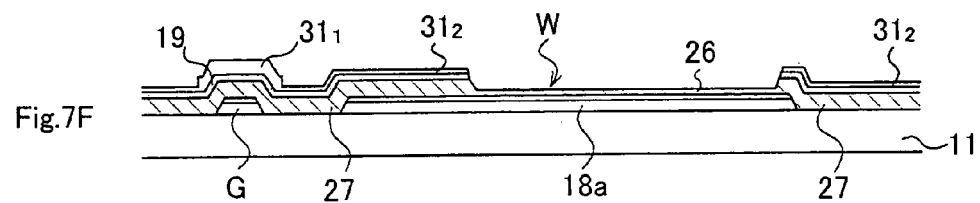
Figure 9:
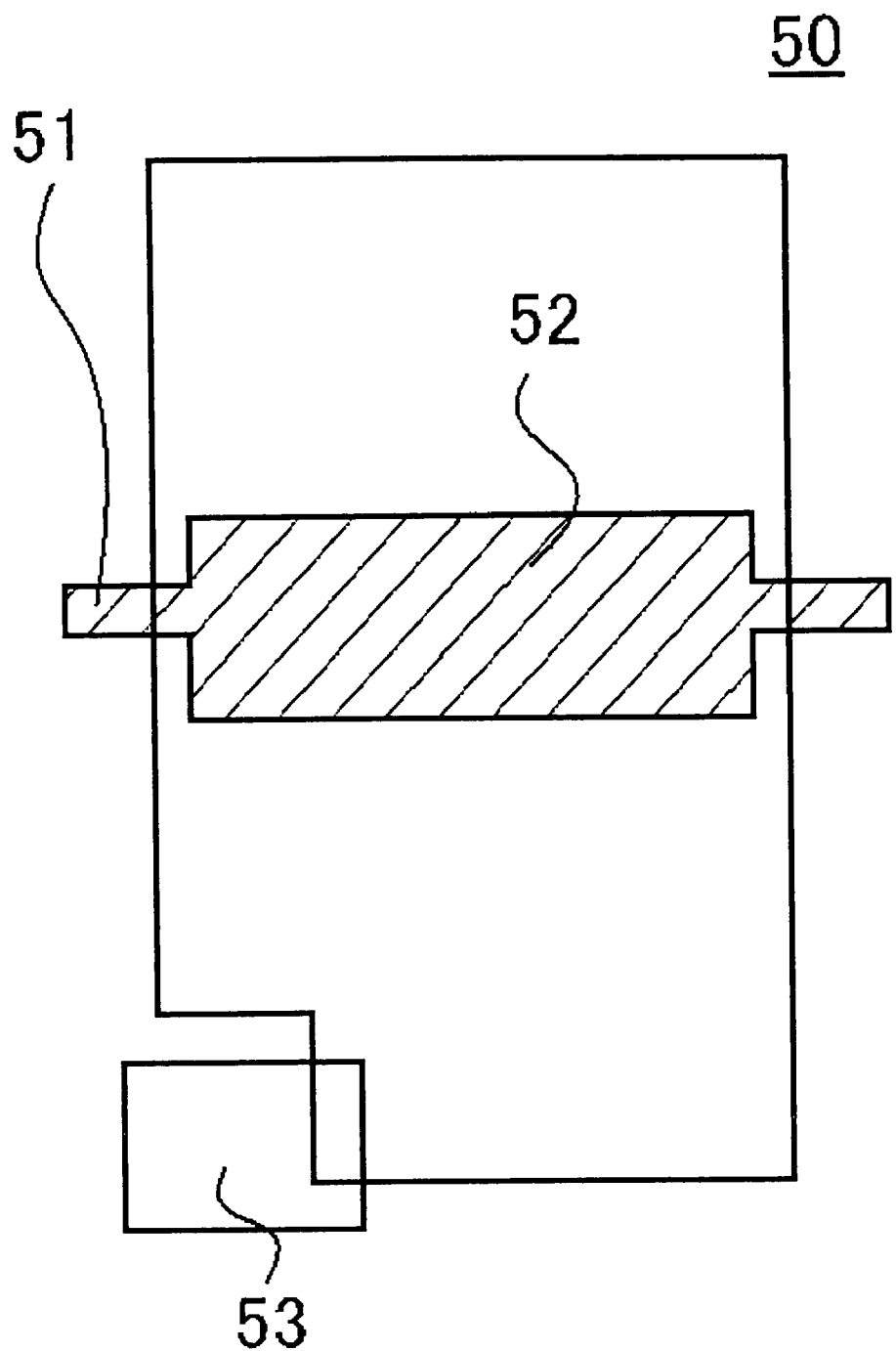
FIG. 9 is a schematic plan view of a single pixel in a related-art liquid crystal display device.
Figure 10:
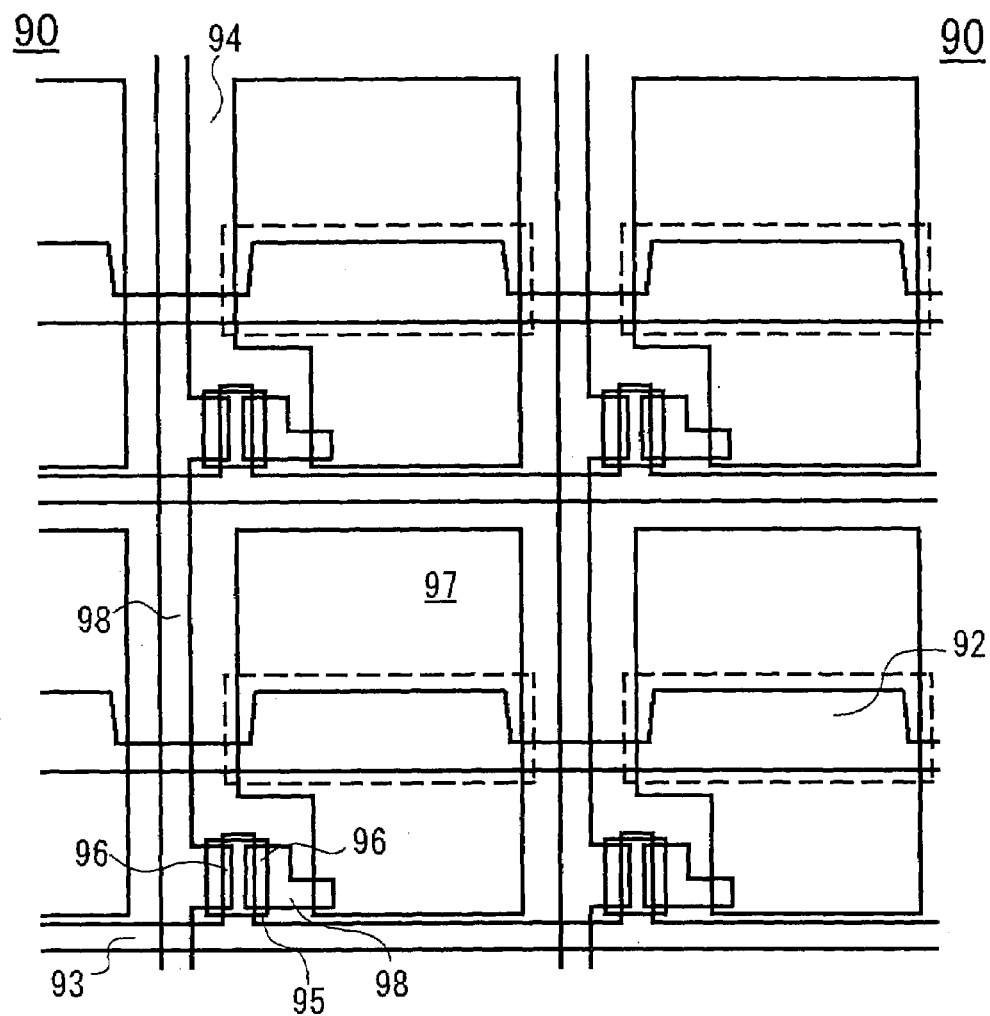
FIG. 10 is a plan view of several pixels of an array substrate in another related-art example.
Figure 11A:
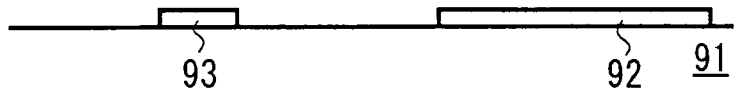
FIG. 11A to FIG. 11G are partial cross-sectional views showing in sequence the process of manufacturing the array substrate of FIG. 10.
Figure 11B:
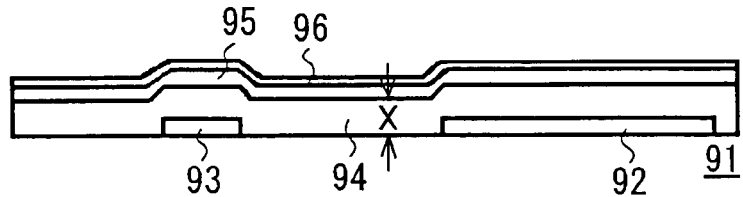
Figure 11C:
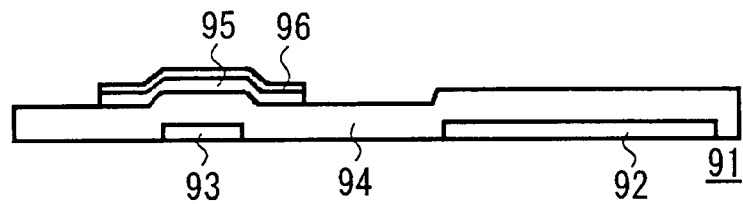
Figure 11D:
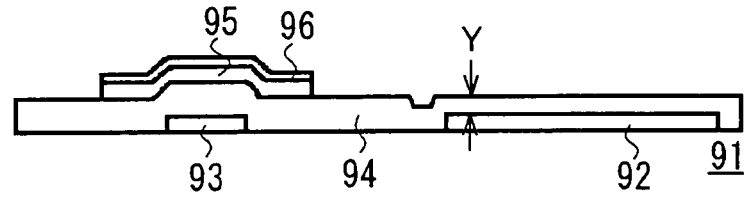
Figure 11E:
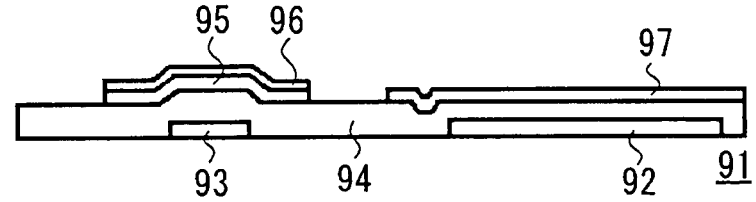
Figure 11F:
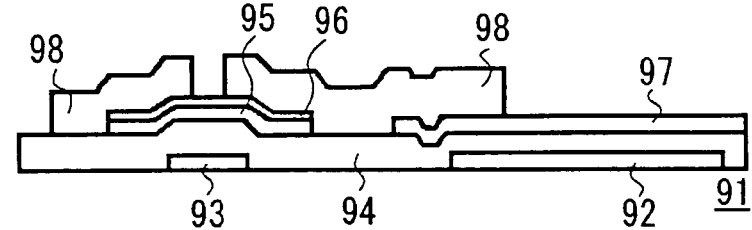
Figure 11G:
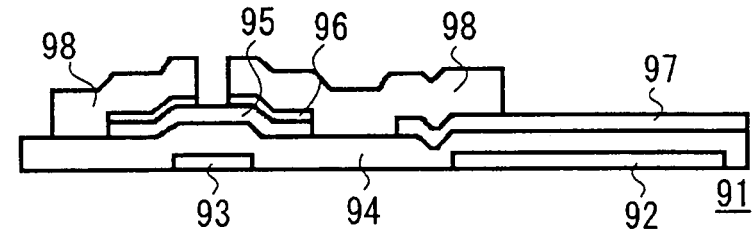
Figure 12:
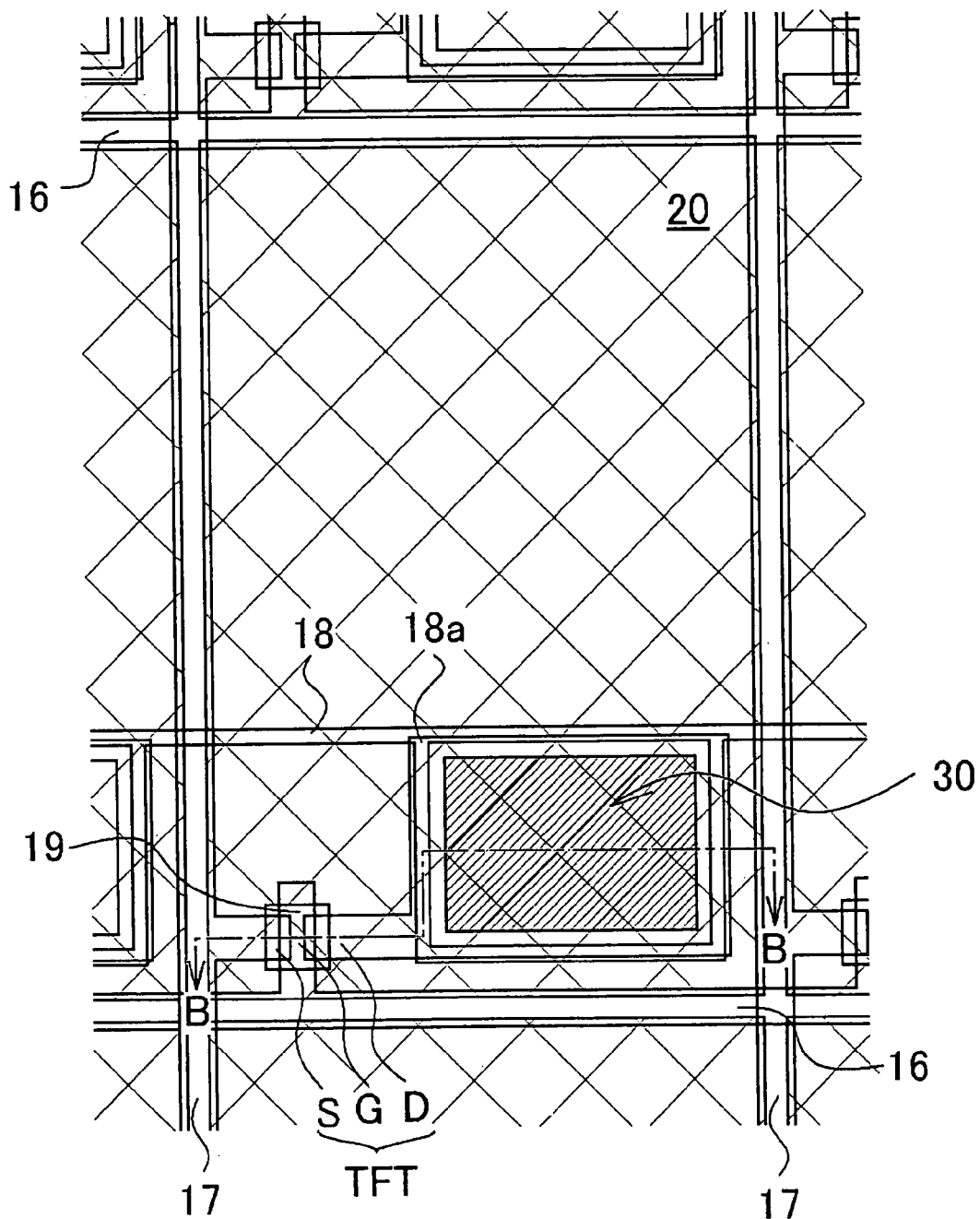
FIG. 12 is a plan view of a portion corresponding to a single pixel, enlarged and viewed through a color filter substrate, in a liquid crystal display device of the prior invention.
Figure 14A:
FIG. 14A to FIG. 14G are cross-sectional views illustrating the processes for manufacturing an array substrate of FIG. 12.
Figure 14B:
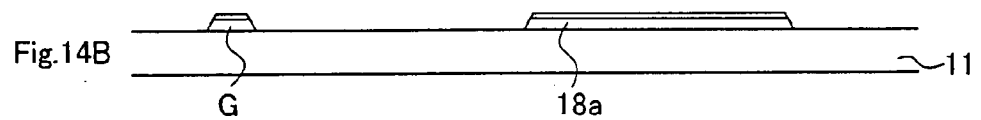
Figure 14C:
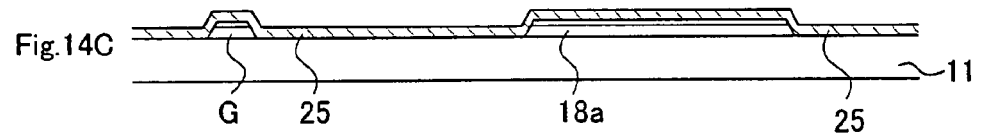
Figure 14D:
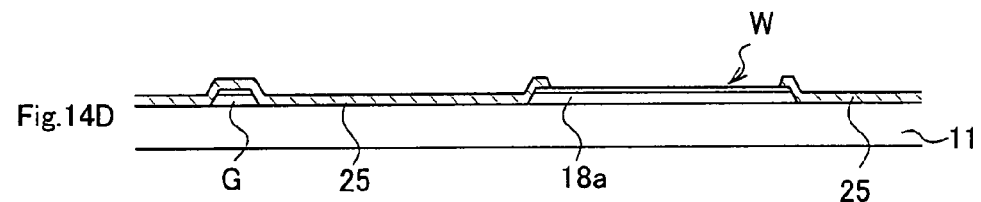
Figure 14E:
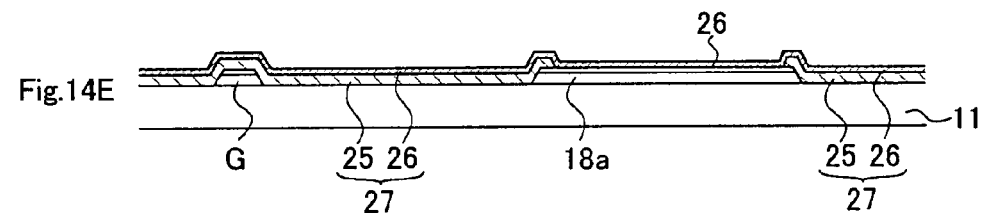
Figure 14F:
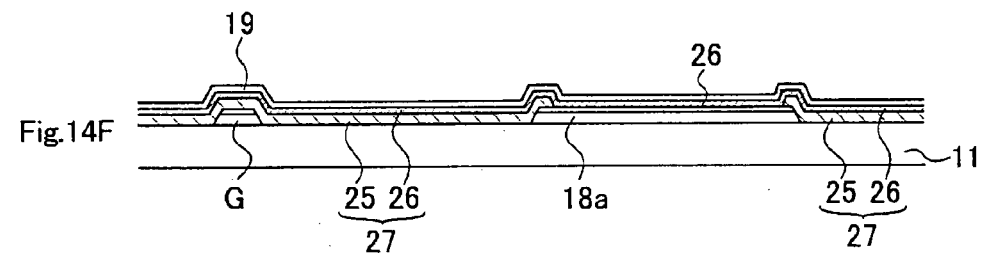
Figure 14G:
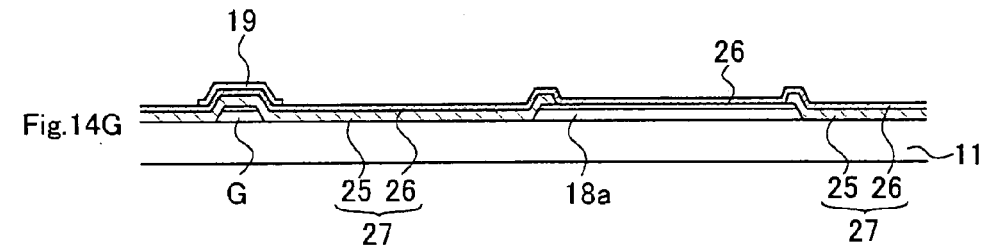
Figure 15A:
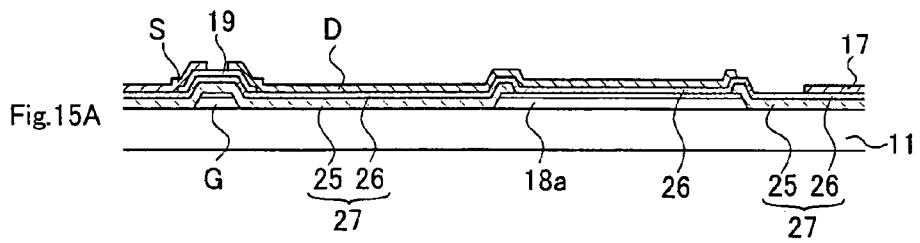
FIG. 15A to FIG. 15E are cross-sectional views illustrating the process subsequent to FIG. 14G of manufacturing the array substrate of FIG. 12.
Figure 15B:
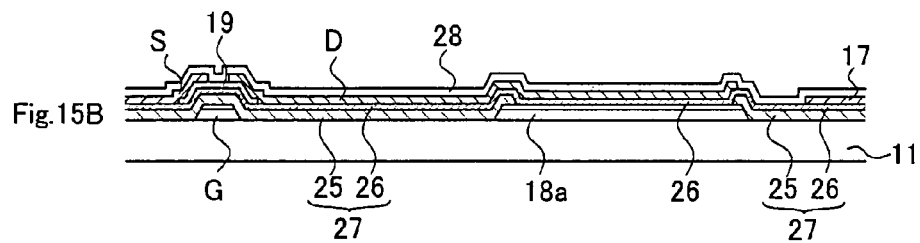
Figure 15C:
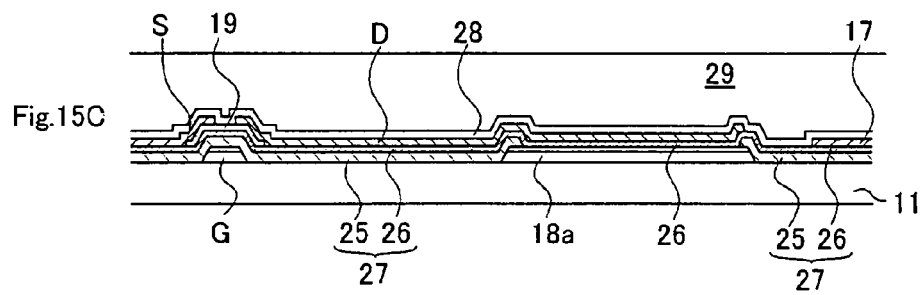
Figure 15D:
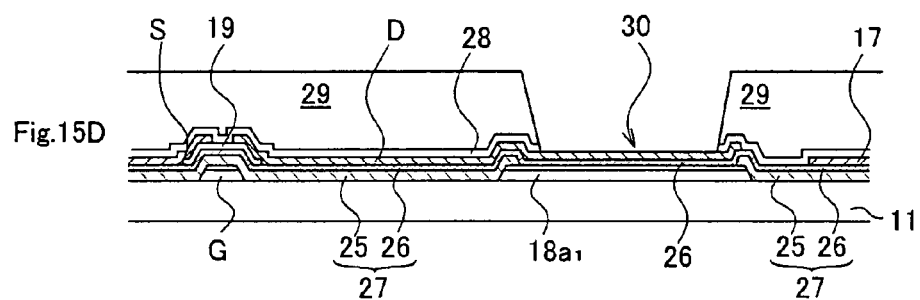
Figure 15E:
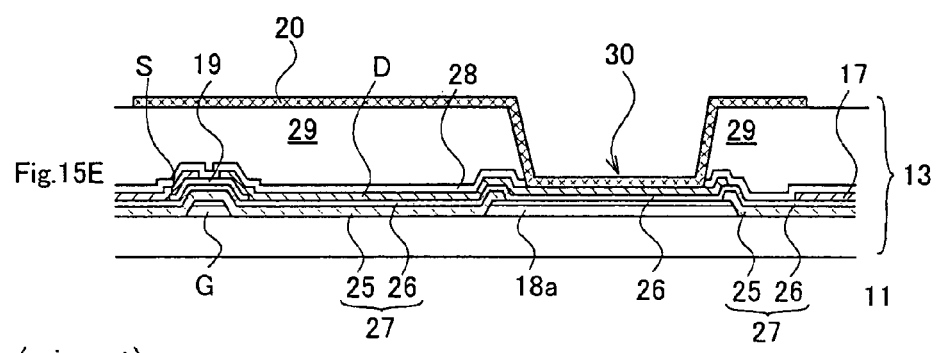

In this state, the semiconductor layer 19 on the surface of the auxiliary capacity electrode 18a is removed so as to expose the first insulating film 27 by means of dry etching, and then as shown in FIG. 7F, by wet etching using buffered hydrofluoric acid or by dry etching, a part of the first insulating film 27 that is exposed on the surface of the auxiliary capacitor electrode 18a is removed so that the thinned insulating layer 26 of a prescribed thickness (for example, 500 Å to 1500 Å) remains unremoved.

Next, the thin photoresist layer $31_2$ is removed by ashing to expose the semiconductor layer 19, as shown in FIG. 8A. In this process, the thick photoresist layer $31_1$, which has been located above the gate electrode G, remains unremoved coating the semiconductor layer 19, though the thick photoresist layer $31_1$ becomes thinner because part thereof is ashed away. Then, the exposed semiconductor layer 19 is removed by dry etching, as shown in FIG. 8B.

Then, the thick photoresist layer $31_1$, which has been located above the gate electrode G, is removed by ashing, and after the conductive material layer of a prescribed thickness made of aluminum, molybdenum, chromium, or their alloy has been formed on the transparent substrate 11, patterning is performed to form the multiple signal lines 17 that extend in a direction perpendicular to the scan line 16, the source electrode S that is extended from the signal line 17 and coupled to the semiconductor layer 19, and the drain electrode D that covers over the first insulating film 27 including the thinned insulating layer 26 on the auxiliary capacitor electrode 18a and has one end coupled to the semiconductor layer 19, as shown in FIG. 1 and FIG. 8C. In this way, the TFT serving as a switching element is formed in the neighborhood of the intersection between the scan line 16 and signal line 17 on the transparent substrate 11. Furthermore, as shown in FIG. 8D, on the transparent substrate 11 so as to cover these wiring lines, a second insulating film 28, which is made of inorganic insulating material (for example, silicon nitride) to stabilize the surface, is formed. Next, an interlayer 29, which is made of organic insulating material, such as polyimide, to flatten the surface of the array substrate 13, is formed.

Then, as shown in FIG. 8E, by means of etching, the contact hole 30 is formed to the interlayer 29 and protective insulating film 28, which are located on the drain electrode D at the position of the region x (refer to FIG. 3E) on the auxiliary capacitor electrode 18a. In this case also, because the region x is formed on the side closer to the TFT than is the auxiliary capacity forming region y, that is, because the contact hole 30 is closer to the TFT than is the auxiliary capacity forming region y, the delay in writing to the pixel electrode 20 via the contact hole 30 can be reduced. When the contact hole 30 is formed, short-circuiting does not occur between the drain electrode D and auxiliary capacitor electrode 18a in the portion where the contact hole 30 is formed, because the thick first insulating film 27, which is composed of two layers of both the thick insulating layer 25 and the thinned insulating layer 26, lies under the drain electrode D located in the region x. For the same reason, a capacity is formed also in the region x, resulting in an increase of capacitance in a single pixel. In addition, because the position where the contact hole 30 is formed is located above the auxiliary capacitor electrode 18a, which is made of light-blocking material, the variation in display quality, which is caused by the difference in the inter-substrate distance from other portions occurring when the array substrate 13 is bonded with the color filter substrate 14 to produce the liquid crystal display device 10C, becomes unnoticeable.

Then, as shown in FIG. 8F, in each pixel region enclosed by the scan lines 16 and signal lines 17 is formed the pixel electrode 20 made of, for example, ITO. At this point, for the prevention of light leakage, it is preferable to provide the pixel electrode 20 so that a part thereof is located on the scan line 16 and signal line 17, and the neighboring pixel electrodes 20 are not in contact with each other. With the above process, manufacture of the array substrate 13 of the liquid crystal display device 10C according to the third embodiment is completed.

For the auxiliary capacity of the array substrate 13 formed through the above-described manufacturing processes according to the third embodiment, the auxiliary capacitor electrodes 18a and the drain electrode D coupled to the pixel electrode 20 are equivalent to the electrodes of a capacitor, and the thinned insulating layer 26 interposed between the auxiliary capacitor electrodes 18a and drain electrode D is equivalent to the dielectric body of a capacitor. Moreover, the thickness of the dielectric body composed of the thinned insulating layer 26 can be made significantly smaller, that is 500 Å to 1500 Å, than the conventionally used gate insulating film with the thickness of 2500 Å to 4500 Å. Thus, the auxiliary capacitance can be dramatically increased without enlarging the area of the auxiliary capacitor electrodes 18a. In addition, because the gate electrode G, scan lines 16, and the portion where the contact hole 30 is formed are covered by the first insulating film 27, which is thicker than the thinned insulating layer 26, sufficient insulation performance is secured, and short circuit becomes less likely to occur between the drain electrode D and auxiliary capacitor electrodes 18a.

In the above-described third embodiment, the first insulating film 27 has been shown as composed of a single silicon nitride layer. Because the first insulating film 27 is homogeneous in such a case, the etching time needs to be strictly controlled when forming the thinned insulating layer 26, by applying wet etching to the first insulating film 27 using buffered hydrofluoric acid. However, by making the first insulating film 27 have a multi-layered structure composed of materials of various etching rates, the etching condition can be made flexible, thus making manufacturing easy. For example, first a hard silicon nitride layer is provided on the transparent substrate 11 with a raised temperature, and then a soft silicon nitride layer is stacked on it with a lowered temperature of the transparent substrate 11. In this case, because the soft silicon nitride layer has a large etching rate due to buffered hydrofluoric acid, the hard silicon nitride layer in the lower layer is hardly etched even if there is some error in etching time. Therefore, the thinned insulating layer 26 can be obtained with an accurate thickness.

Whereas the above-described third embodiment is shown as an example in which the first insulating film 27 is made of silicon nitride, it may be formed of silicon oxide or other, or making it a multi-layered structure, either one of its layer may be formed of silicon oxide while the other layer is of silicon nitride. However, the uppermost layer should preferably be made of silicon nitride, from the viewpoint of insulating performance.

As described above, according to the liquid crystal display 10C of the third embodiment, because the auxiliary capacitance can be increased without enlarging the area of the auxiliary capacitor electrode 18a, and short circuit becomes less likely to occur between the drain electrode D and auxiliary capacitor electrodes 18a, the number of bright point defects is reduced, and the defective display such as cross talk or flicker can be suppressed without a reduction in the aperture ratio of each pixel.

Also, according to the method for manufacturing the liquid crystal display 10C of the third embodiment, because the gate insulating film and semiconductor layer is formed in a continuous sequence, the number of processes of retaining the surrounding pressure of the substrate from normal pressure to vacuum can be smaller by one, comparing with the method by the related-art example in which the semiconductor layer is formed after the gate insulating film formation and etching processes, and the semiconductor layer lying on the surface of the auxiliary capacitor lines can be etched away using as a mask the photoresist layer left around the auxiliary capacitor lines by the half-tone mask. Furthermore, deterioration of TFT characteristics is reduced because the influence of contamination occurring in the etching process of the gate insulating film becomes less likely to be produced. In addition, according to the method for manufacturing the liquid crystal display 10C of the third embodiment, because after the semiconductor layer on the surface of the auxiliary capacitor lines has been etched, an insulating layer can be formed by etching, directly using the remaining photoresist layer and semiconductor layer as masks, no photolithography process needs to be specially provided when forming the insulating layer, though an etching process of the semiconductor layer is added after the formation of the insulating layer.

What is claimed is:

1. A liquid crystal display device comprising:
    a transparent substrate;
    multiple signal lines and multiple scan lines provided in a matrix on the transparent substrate;
    multiple auxiliary capacitor lines provided in between the scan lines in parallel with the scan lines;
    a thin film transistor including a source electrode, a gate electrode and a drain electrode provided near each intersection of the signal lines and the scan lines; and
    a pixel electrode provided in each area defined by the signal lines and the scan lines, the pixel electrode electrically coupled to the drain electrode of the thin film transistor;
    the gate electrode of the thin film transistor, the scan lines, and the auxiliary capacitor lines being covered with a first insulating film, and a thinned insulating layer is formed as a part of the first insulating film on the auxiliary capacitor lines;
    the drain electrode being extended on the first insulating film so as to cover surfaces of a thick insulating layer and the thinned insulating layer of the first insulating film;
    a second insulating film being formed in between the pixel electrode and the drain electrode;
    a portion defining a contact hole being formed in the second insulating film positioned on the drain electrode on the thick insulating layer of the first insulating film; and
    the pixel electrode and the drain electrode being electrically coupled via the contact hole.

2. The liquid crystal display device according to claim 1, wherein the contact hole is positioned on the drain electrode formed on the thick insulating layer of the first insulating film on the auxiliary capacitor lines.

3. The liquid crystal display device according to claim 1, wherein the contact hole formed on the drain electrode on the thick insulating layer of the first insulating film is positioned closer to the thin film transistor than to the thinned insulating layer.

4. The liquid crystal display device according to claim 1, wherein the thinned insulating layer of the first insulating film of a multi-layered structure is an uppermost layer.

5. The liquid crystal display device according to claim 1, wherein the thinned insulating layer of the first insulating film of a multi-layered structure is a layer formed closest to the transparent substrate.

6. The liquid crystal display device according to claim 1, wherein the thinned insulating layer of the first insulating film of a multi-layered structure is the thinnest layer.

7. The liquid crystal display device according to claim 1, wherein edges of the thinned insulating layer on the auxiliary capacitor lines are positioned further inside than edges of the auxiliary capacitor lines.

8. The liquid crystal display device according to claim 7, wherein edge portions of the auxiliary capacitor line are covered with the first insulating film.

9. The liquid crystal display device according to claim 1, wherein the thickness of the first insulating film is 2500 to 5500 Å and the thickness of the thinned insulating layer is 500 to 1500 Å.

10. A method for manufacturing a liquid crystal display device comprising:
    providing on a transparent substrate, multiple scan lines and multiple auxiliary capacitor lines so as to be parallel with each other;
    forming a first insulating film so as to cover the entire surface of the transparent substrate, and forming a thinned insulating layer as a part of the first insulating film on the auxiliary capacitor lines;
    forming a semiconductor layer on a surface of the first insulating film in a position corresponding to a gate electrode formed on a part of the scan lines;
    providing multiple signal lines each having a portion formed with a source electrode so as to intersect with the scan lines, and forming a drain electrode so as to cover surfaces of a thick insulating layer and the thinned insulating layer of the first insulating film;
    forming a second insulating film so as to cover the substrate surface mounted with the signal lines, the source electrode, and the drain electrode;
    forming a contact hole on the second insulating film positioned on the drain electrode on the thick insulating layer of the first insulating film; and
    forming a pixel electrode on the second insulating film so as to be electrically coupled with the drain electrode via the contact hole.

11. The method for manufacturing a liquid crystal display device according to claim 10, wherein
    the forming the thinned insulating layer comprises:
        forming the first insulating film into multiple layers in multiple times; and
        removing at least one layer among the multiple layers.

12. The method for manufacturing a liquid crystal display device according to claim 11, wherein
    the forming the thinned insulating layer comprises:
        removing a first-formed layer among the multiple layers of the first insulating film formed in multiple times.

* * * * *